United States Patent
Fedynyshyn

(10) Patent No.: US 8,158,338 B2
(45) Date of Patent: Apr. 17, 2012

(54) RESIST SENSITIZER

(75) Inventor: Theodore H. Fedynyshyn, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 682 days.

(21) Appl. No.: 12/169,224

(22) Filed: Jul. 8, 2008

(65) Prior Publication Data

US 2010/0009289 A1   Jan. 14, 2010

(51) Int. Cl.
*G03F 7/075* (2006.01)
*G03F 7/038* (2006.01)
*G03F 7/039* (2006.01)
*G03F 7/20* (2006.01)
*G03F 7/30* (2006.01)

(52) U.S. Cl. ............ 430/926; 430/270.1; 430/325; 430/326; 430/905; 430/914; 430/942

(58) Field of Classification Search .............. None
See application file for complete search history.

(56) References Cited

U.S. PATENT DOCUMENTS

| | | |
|---|---|---|
| 4,535,053 A | 8/1985 | West et al. |
| 4,578,344 A | 3/1986 | Griffing et al. |
| 4,591,546 A | 5/1986 | West et al. |
| 4,672,021 A | 6/1987 | Blumel et al. |
| 4,677,049 A | 6/1987 | Griffing et al. |
| 4,693,960 A | 9/1987 | Babich et al. |
| 4,702,996 A | 10/1987 | Griffing et al. |
| 4,777,111 A | 10/1988 | Blumel et al. |
| 4,804,614 A | 2/1989 | Halle |
| 4,859,789 A | 8/1989 | Griffing et al. |
| 4,871,646 A | 10/1989 | Hayase et al. |
| 4,921,321 A | 5/1990 | Weidman |
| 4,942,113 A | 7/1990 | Trundle |
| 4,990,665 A | 2/1991 | Griffing et al. |
| 5,055,439 A | 10/1991 | Allen et al. |
| 5,108,874 A | 4/1992 | Griffing et al. |
| 5,164,278 A | 11/1992 | Brunsvold et al. |
| 5,171,656 A | 12/1992 | Sebald et al. |
| 5,204,226 A * | 4/1993 | Baier et al. ............ 430/326 |
| 5,238,787 A | 8/1993 | Haluska et al. |
| 5,272,036 A | 12/1993 | Tani et al. |
| 5,330,881 A | 7/1994 | Sidman et al. |
| 5,372,908 A | 12/1994 | Hayase et al. |
| 5,391,442 A | 2/1995 | Tsushima et al. |
| 5,426,160 A | 6/1995 | Bianconi et al. |
| 5,439,780 A | 8/1995 | Joshi et al. |
| 5,476,753 A | 12/1995 | Hashimoto et al. |
| 5,776,764 A | 7/1998 | Ueta |
| 5,780,163 A | 7/1998 | Camilletti et al. |
| 5,795,700 A | 8/1998 | Hatakeyama et al. |
| 5,804,257 A | 9/1998 | Hayashida et al. |
| 5,902,713 A | 5/1999 | Hada et al. |
| 5,932,378 A | 8/1999 | Lee |
| 6,015,625 A | 1/2000 | Morizono et al. |
| 6,025,117 A | 2/2000 | Nakano et al. |
| 6,066,433 A | 5/2000 | Takemura et al. |
| 6,087,064 A | 7/2000 | Lin et al. |
| 6,318,528 B1 | 11/2001 | Blanckaert |
| 6,344,309 B2 | 2/2002 | Fukushima et al. |
| 6,479,212 B1 | 11/2002 | Matsuda et al. |
| 6,759,502 B1 | 7/2004 | Tang et al. |
| 6,989,428 B1 | 1/2006 | Bianconi et al. |
| 7,060,637 B2 | 6/2006 | Li et al. |
| 7,112,615 B2 | 9/2006 | Gleason et al. |
| 7,479,361 B2 * | 1/2009 | Nagahara et al. .......... 430/270.1 |
| 7,625,687 B2 | 12/2009 | Hu et al. |
| 7,629,596 B2 | 12/2009 | Taniguchi |
| 8,034,545 B2 | 10/2011 | Sakurai et al. |
| 2004/0043328 A1 | 3/2004 | Lu |
| 2004/0081912 A1 | 4/2004 | Nagahara et al. |
| 2004/0132857 A1 | 7/2004 | Barton et al. |
| 2005/0266344 A1 | 12/2005 | Sakurai et al. |
| 2007/0264587 A1 | 11/2007 | Hu et al. |
| 2008/0076060 A1 | 3/2008 | Fedynyshyn |
| 2008/0227883 A1 | 9/2008 | Kojima et al. |

FOREIGN PATENT DOCUMENTS

| | | |
|---|---|---|
| EP | 0 435 531 A2 | 7/1991 |
| EP | 0 445 058 A1 | 9/1991 |
| EP | 0 502 677 | 9/1992 |
| EP | 0 780 729 A1 | 6/1997 |
| EP | 0 816 419 A | 1/1998 |
| JP | 23574/1979 | 9/1980 |
| JP | 1106049 | 4/1989 |
| JP | 2000 194128 | 7/2000 |
| JP | 2003-162064 * | 6/2003 |

OTHER PUBLICATIONS

JPO English abstract for JP2000-194128 (Jul. 2000).*
Machine-assisted English translation for JP2000-194128 (Jul. 2000).*
Machine-assisted English translation of JP2003-162064 provided by JPO (2003).*
International Search Report from corresponding PCT/US09/049682, mailed Oct. 29, 2009.
International Search Report, PCT/US08/69413, dated Jan. 11, 2011.
Bianconi, P.A. et al., "Poly(*n*-hexylsilyne): Synthesis and Properties of the First Alkyl Silicon [RSi]*n* Network Polymer," J. Am. Chem. Soc. 110:2342-44 (1988).
CIBA Specialty Chemicals, Photoinitiators for UV Curing, Key Products Selection Guide.
Dabbagh, G. et al., "Positive Tone Processing of Plasma Polymerized Methylsilane," SPIE 3333:394-400, (Jun. 2003).

(Continued)

*Primary Examiner* — Sin J. Lee
(74) *Attorney, Agent, or Firm* — Nutter McClennen & Fish LLP; Thomas J. Engellenner

(57) ABSTRACT

Methods and compositions for enhancing the sensitivity of a resist composition are disclosed. In one aspect, compositions for use with a matrix material (e.g., a lithographically sensitive polymeric material) can be formulated with an acid generator and a sensitizer, where the sensitizer can be present in a relatively small amount. The sensitizer can include a compound with one or more silicon-silicon bonds, and can act to enhance the efficiency of acid generation when the resist is impinged by a selected lithographic radiation. The methods of the present invention can be especially useful in performing short wavelength (e.g., less than 200 nm) lithography, or for processes such as e-beam lithography, which traditionally suffer from low throughput.

51 Claims, 3 Drawing Sheets

OTHER PUBLICATIONS

Hofer, D.C. et al., "Contrast Enhanced UV Lithography with Polysilanes," SPIE—Advances in Resist Tech. 469:108-16 (1984).

Horn, M.W. et al., "Plasma-Deposited Organosilicon Thin Films as Dry Resists for Deep Ultraviolet Lithography," J. Vas. Sci. Technol. B 8(6):1493-1496 (1990).

International Search Report from corresponding PCT Appl No. PCT/US08/69413, dated Mar. 3, 2009.

Jeyakumar, A., "Development of inorganic Resists for Electron Beam Lithography: Novel Materials and Simulations," Thesis, Georgia Institute of Technology School of Chemical & Biomolecular Engineering (May 2004).

Kunz, R.R. et al., "Photo-Oxidation of σ-Conjugated Si-Si Network Polymers," J. Vas. Sci. Technol. A 9(3):1447-51 (1991).

Kunz, R.R. et al., "Polysilyne Resists for 193-nm Excimer Laser Lithography," SPIE—Advances in Resist Tech. & Proc. VIII 1466:218-226 (1991).

Kunz, R.R. et al., "Polysilyne Thin Films as Resists for Deep Ultraviolet Lithography," J. Vac. Sci. Technol. B 8(6):1820-25 (1990).

Lalevee, J. et al., "Photocleavage Processes in an Iminosulfonate Derivative Usable as Photoacid in Resist Technology," Chem. Ltrs. 32(2):178-79 (2003).

Lange, B. et al., "3D Defect Engineering in Polymer Opals," Proc. SPIE 6182 (2006).

Linehan, L. et al., "INR: A Negative Tone I-Line Chemically Amplified Photoresist," SPIE 2195:307-319, (Nov. 2004).

Miller, R.D. et al., Polysilanes: Photchemistry and Deep UV Lithography, Society of Plastic Engineers, Inc., Photopolymers: Principles, Processes and Materials—Regional Technical Conference, Brookfield Center, CT pp. 111-120 (Oct. 30-Nov. 2, 1988).

Miller, R.D., "New Materials for Optical Microlithography," J. Imaging Sci. 31(2):43-46 (1987).

Miller, R.D., "Polysilane High Polymers," Chem. Rev. 89:1359-1410 (1989).

Miller, R.D., "Polysilanes: Radiation Sensitive Materials for Microlithography," Polymer Preprints, Div. Polymer Chem., Am. Chem. Soc. 31(2):252-53 (1990).

Nouveau, A. et al., "Synthesis and Photoresist Properties of Copolymers of Trimethylsilylmethyl Methacrylate and Oximinoketones Methacrylates," Society of Plastic Engineers, Inc., Photopolymers: Principles, Processes and Materials—Regional Technical Conference, Brookfield Center, CT pp. 339-351 (Oct. 30-Nov. 2, 1988).

Noppakundilograt, S. et al., "Vis-sensitive Photopolymer Containing Vinyl Ether Compound and Pyrromethene Dye," Polym. Adv. Technol. 13:527-33 (2002).

Peng, C. et al., "The Design of Silicon-Based Polyimide as a Submicron Resolution Directly Imagable Electron Beam Resist," Society of Plastic Engineers, Inc., Photopolymers: Principles, Processes and Materials—Regional Technical Conference, Brookfield Center, CT pp. 373-392 (Oct. 30-Nov. 2, 1988).

Pohlers, G. et al., "Ionic vs Free Radical Pathways in the Direct and Sensitized Photochemistry of 2-(4'-Methoxynaphthyl)-4,6-bis(trichloromethyl)-1,3,5-triazine: Relevance for Photoacid Generation," J. Am. Chem. Soc. 121:6167-75 (1999).

Rosilio, C. et al., "Contribution to the Study of Polysilanes for Photolithography," Microelectronic Eng. 6(1-4):399-406 (1987).

Rosilio, C. et al., "Contribution to the Study of Polysilanes for High-Resolution Photolithography," Microelectronic Eng. 8(1-2):55-78 (1988).

Rosilio, C. et al., "Design of Silicon Containing Resists for Deep UV Bilayer Lithography," Society of Plastic Engineers, Inc., Photopolymers: Principles, Processes and Materials—Regional Technical Conference, Brookfield Center, CT pp. 145-155 (Oct. 30-Nov. 2, 1988).

Rothschild, et al., "Effects of Excimer Laser Irradiation on the Transmission, Index of Refraction, and Density of Ultraviolet Grade Fused Silica," Appl. Phys. Lett. 55(13):1276-78 (1989).

Selvaraju, C. et al., "Excited State Reactions of Acridinedione Dyes with Onium Salts: Mechanistic Details," J. Photochem. & Photobiol. A:Chem. 138:213-26 (2001).

Sezi, R. et al., "Silicon Containing Resists for I-Line and Deep-UV Application," Society of Plastic Engineers, Inc., Photopolymers: Principles, Processes and Materials—Regional Technical Conference, Brookfield Center, CT pp. 133-143 (Oct. 30-Nov. 2, 1988).

ShinEtsuMicroSi Contrast Enhancement Materials pamphlet, Phoenix, AZ (revised Aug. 12, 2003), available at http://www.microsi.com/photolithography/cem.htm (obtained on Apr. 8, 2009).

Suyama, K. et al., "Generation of Pendant Amino Groups on Irradiation of Visible Light in the Presence of Benzoquinonylsulfanyl Derivatives," J. Photopolymer Sci. & Tech. 14(5):745-48 (2001).

Suzuki, S. et al., "Pyrromethane Dye Sensitized Photopolymer and the Application to Visible Laser Direct Imaging," J. Photopolym. Sci. Technol. 117(1):125-29 (2004).

Thomes, W.J. et al., "Photobleaching Comparison of Poly(methylphenylsilylene) and Poly(phenylsilyne)," J. Appl. Phys. 96(11):6313-18 (2004).

Uchino, S. et al., "Contrast Enhancement Materials Using Water Soluble Diazonium Salts for g-Line Stepper," Polymeric Materials Sci. & Eng., Proceedings of the ACS Div. of Polymeric Materials Sci & Eng., Washington, DC 55:604-607 (1986).

Umehara, A. et al, "Application of Silicon Polymer as Positive Photosensitive Material," Society of Plastic Engineers, Inc., Photopolymers: Principles, Processes and Materials—Regional Technical Conference, Brookfield Center, CT pp. 121-131 (Oct. 30-Nov. 2, 1988).

Watanabe, H. et al., "Carbazole as Photo-Sensitizer in Photoresist," J. Photopolymer Sci. & Tech. 14(2):263-64 (2001).

West, P.R. et al., "Contrast Enhanced Photolithography: Application of Photobleaching Processes in Microlithography," J. Imaging Sci. 30(2):65-68 (1986).

Official Action dated Nov. 14, 2011 in U.S. Appl. No. 12/497,851.

* cited by examiner

RESIST SENSITIZER

STATEMENT REGARDING FEDERALLY SPONSORED RESEARCH OR DEVELOPMENT

This invention was made with U.S. government support under DARPA/MTO contract number FA8721-05-C-0002. The government has certain rights in the invention.

FIELD OF THE APPLICATION

The present application relates to compositions and methods of their use, particularly as directed to electronics manufacturing, lithographic applications, and materials sensitive to lithographic radiation.

BACKGROUND

Manufacturing of integrated circuits has been enabled by high-performance spin-on organic polymeric resists. In addition to sensitivity and resolution requirements, resists must maintain critical linewidth control throughout the patterning process, including both imaging and subsequent transfer via processes such as plasma etch. For example, line-edge roughness on the order of 5-10 nm is a concern at 250 nm, but can render a lithographic process unworkable when critical dimensions fall to below 100 nm.

Until the late 1980s, the radiation sources used in lithographic processes were high-power mercury lamps, first at 436 nm and then followed by 365 nm. Then the transition took place to the krypton fluoride excimer lasers at 248 nm, and more recently to the argon fluoride excimer lasers at 193 nm, and eventually to molecular fluorine lasers at 157 nm. Mass-produced semiconductor manufacturing entered the era of nanopatterning with UV optical lithography when the smallest feature sizes crossed the 100-nm threshold. In the last two years advanced devices have had their half-pitch at 90 nm using 193-nm dry exposures, and it is widely expected to extend to 45-nm half-pitch by incorporating liquid immersion. Indeed, according to the international roadmap for semiconductors (ITRS), this trend will continue unabated for at least one more decade with expected resolution decreasing to 45 nm in 2010, and 32 nm in 2013. Accordingly, a need exists to develop future imaging technologies such as extreme ultraviolet (EUV) lithography or maskless electron beam.

One alternative to conventional projection optical lithography is EUV lithography, when extremely small wavelength photons (13.4 nm) are employed in imaging. It is thought that EUV will be employed to 32-nm nm half-pitch and possibility down to 25-nm nm half-pitch when finally developed. One difficulty with EUV is the lack of a high power photon source, which will limit the manufacturing throughput without the introduction of very high sensitivity resists. To get high-throughput EUV systems, the laser source must be improved to generate more of the extreme ultraviolet radiation, or light. Today's best YAG lasers generate only about 10 Watts of radiation. The power level must be boosted to 100 Watts or more for high-throughput commercial production. Even at this power level, resist sensitivity must improve significantly.

A second alternative to conventional projection optical lithography is maskless electron beam lithography, due to its intrinsically high resolution. The limitation of electron-beam lithography is, however, its relatively low throughput. Until recently, this limitation far outweighed cost considerations of optical projection systems and photomasks. However, the balance is beginning to tilt in the other direction, both because optical lithography is becoming increasingly expensive and because novel concepts of electron-beam systems may significantly boost their throughput. Enhanced throughputs may be sufficient to enable prototyping at reduced cost and turn-around time, and even enable cost-effective production of low-volume (<1000 wafer) device runs. Electron-beam lithography can be looked at as a replacement or an alternative for advanced lithographic technologies such as hyper-NA 193-nm or EUV lithography that may be unavailable or not cost effective for low volume device producers. Nonetheless, for maskless electron-beam lithography to be successfully utilized in integrated circuit fabrication, resist sensitivity will have to be significantly increased.

Accordingly, a need exists for resist formulations and components thereof that will increase the resist sensitivity to imaging lithographic radiation. As well, it is advantageous to achieve such increases in sensitivity without substantial losses in linewidth roughness.

SUMMARY

Methods and compositions for enhancing the sensitivity of a resist composition are disclosed. In one aspect, compositions for use with a matrix material (e.g., a lithographically sensitive polymeric material) can be formulated with an acid generator and a sensitizer, where the sensitizer can be present in a relatively small amount. The sensitizer can include a compound with one or more silicon-silicon bonds, and can act to enhance the efficiency of acid generation when the resist is exposed to lithographic radiation. The methods of the present invention can be especially useful in performing short wavelength (e.g., less than 200 nm) lithography, or for processes such as e-beam lithography, which traditionally suffer from low throughput.

In one embodiment, a resist capable of being imaged by lithographic radiation can be formed on a substrate. The resist can include any combination of materials as described herein. For example, the resist can include an acid-generator for creating an acid when the resist is exposed to the lithographic radiation. A sensitizer for increasing the sensitivity of the resist to the lithographic radiation is also included. The sensitizer can include a compound having at least one silicon-silicon bond. A matrix material (e.g., a polymer-based material) can also be included in the resist. The matrix material can be reacted in an acid-catalyzed reaction using acid created by the acid-generator. Application of the lithographic radiation to the resist can thereby result in resist imaging. For example, the application of lithographic radiation can result in at least partial bleaching of a portion of the resist and/or oxidation of one or more silicon-silicon bonds in the sensitizer to enhance imaging of the resist. The lithographic radiation can include any of electromagnetic radiation (e.g., in a range of about 0.1 nm to about 260 nm, or in a range of about 140 nm to about 220 nm, or EUV, or x-ray radiation), ion beams, and electron beams. A developer can be contacted with the resist, which can serve to remove portions of the resist exposed to the lithographic radiation, or to remove portions of the resist unexposed to the lithographic radiation.

The presence of a sensitizer in the resist can affect lithographic performance in one or more ways. Such changes can be relative to a resist composition that is substantially similar except that the composition substantially lacks the sensitizer. For instance, the lithographic radiation application can increase acid production in a resist with the sensitizer. The sensitizer can increase the sensitivity (e.g., by increasing acid production) of the resist by at least about 1%, 10%, or 100% relative to a resist with the sensitizer removed. In some instances, the sensitizer can act to reduce the absorbance of a portion of the resist after exposure to lithographic radiation (e.g., by undergoing a chemical transformation to a lower absorbing material).

Some exemplary embodiments are drawn toward compositions for generating an acid during lithographic processing. The composition, which can be a mixture (e.g., substantially mixed and/or evenly distributed components), can include an acid-generator capable of creating an acid when activated by lithographic radiation. The composition can also include a sensitizer for increasing efficiency of acid generation when activated by lithographic radiation, where the sensitizer includes a compound having at least one silicon-silicon bond. The sensitizer can increase acid creation in the composition when the composition is exposed to a selected lithographic radiation relative to not having the sensitizer in the composition. The sensitizer and/or composition can also include one or more silicon-silicon bonds that are susceptible to oxidation upon exposure to lithographic radiation. Such compositions can be combined with other materials (e.g., a matrix material) to form a resist composition.

In another embodiment, the sensitizer-containing composition includes a polymer (e.g., copolymer) having multiple silicon-silicon bonds, which may capable of being bleached by actinic radiation in some instances. At least a portion of the polymer can be a polysilane, a polysilyne, or a combination of both. Polysilanes can include a plurality of units represented by the following structural formula:

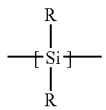

where each occurrence of R need not be the same in chemical identity with another instance of R. The repeat units can optionally be adjacent to one another. The number of repeat units in a polysilane, which can optionally be adjacent to one another, can range from about 20 to about 35,000. In some embodiments, the average molecular weight to the polysilane can be in a range of about 1,000 daltons to about 2,000,000 daltons.

In some embodiments, the sensitizer can include a polymer having polysilyne units. Examples of polysilynes (e.g., units, segments, or homopolymers) include poly(iso-butylsilyne) and a poly(cyclohexylsilyne). The polysilyne can include a plurality of units represented by the following structural formula:

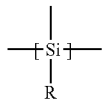

Each R in the above structural formulas can be an independent an organic moiety. For example, the polysilyne units can include at least one of propylsilyne units, butylsilyne units, hexylsilyne units, amylsilyne units, and phenylsilyne units. Accordingly, polysilane or polysilyne units in a polymer can all have the same R group, or can have more than one type of R group. The repeat units can optionally be adjacent to one another. The number of repeat units in a polysilyne, which can optionally be adjacent to one another, can range from about 20 to about 5,000. In some embodiments, the average molecular weight to the polysilyne can be in a range of about 1,000 daltons to about 200,000 daltons.

In another embodiment, the sensitizer-containing composition includes a non polymeric composition (e.g., an organosilicon composition). The composition can include a backbone having a plurality of silicon atoms; the backbone can be a linear silicon chain, or a cyclic silicon chain (e.g., as found in dodecamethylcyclohexasilane). One example of an organosilicon containing composition includes a molecule with units according to the following structural formula:

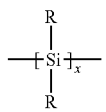

wherein each R is independently an organic moiety, and x is an integer in the range of 2 to 19.

R in any of the structures discussed herein (e.g., with respect to polysilanes, polysilynes, and/or non-polymeric organosilicon compositions) can be an aliphatic or aromatic organic moiety, which is either substituted or unsubstituted. In some embodiments, R is an aliphatic moiety that is optionally substituted. For example, R can be an unsubstituted aliphatic with 1 to 20 carbon atoms, or an unsubstituted fluoroaliphatic moiety. Non-limiting examples of unsubstituted aliphatic moieties include methyl, ethyl, propyl, butyl, pentyl, hexyl, heptyl, octyl, decyl, dodecyl, and tetradecyl. The number of substitutions in a R group can be one or more. The R groups, on one unit or on any number of the units, can all be the same, can all be different, or can have some degree of repetition. Potential substitutions can include one or more of the following including acetal, acyl halide, alcohol, aldehyde, alkane, alkene, alkoxy, alkyne, amide, amine, ammonium, arene, azide, heteroarene, azide, carboxylic acid, disulfide, epoxide, ester, ether, fluoroalcohol, halide, hydroxyl, ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol. In another embodiment, R includes a substituted or unsubstituted carbocylic aromatic group. Examples include phenyl, benzyl, tolyl, naphthyl, and anthracyl. R can also include an acid labile protecting group, such as a carboxylic acid, phenol, or a fluoroalcohol.

In some embodiments, a sensitizer-containing composition can be formulated as a resist composition. In such instances, any of the sensitizer-containing compositions disclosed herein can be combined with a matrix material, such as a polymer-based material. Some matrix materials can be capable of undergoing an acid-catalyzed reaction with the acid formed by an acid-generator in the resist composition. Other components can also be included in the resist, such as a base additive. In some instances, the resist composition can contain a small amount of sensitizer relative to the total amount of resist, or relative to the total amount of sensitizer, acid generator, and matrix material. For example, the sensitizer can be less than about 0.20, or less than about 0.10, weight fraction; or can be in a weight fraction range from about 0.001 to about 0.20, or from about 0.005 to about 0.10, relative to the total amount of resist, or relative to the total amount of sensitizer, acid generator, and matrix material.

Other exemplary embodiments are drawn to kits for forming a resist material. The components of the kits, which can be packaged together or separately in individual or combinatorial components, can include any of the components of the compositions described herein, with any of the features or proportions described herein. For example, the kit can include an acid generator, a sensitizer (e.g., at least one of a polysilane, a polysilyne, and a non-polymeric organosilicon composition), and a matrix material. The three components can be packaged together, or at least two of the components can be packaged together.

BRIEF DESCRIPTION OF THE DRAWINGS

The present application will be more fully understood from the following detailed description taken in conjunction with the accompanying drawings (not necessarily drawn to scale), in which.

DETAILED DESCRIPTION OF SOME EMBODIMENTS

Figure 1A:
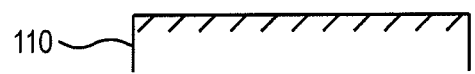
FIGS. 1A-1E depict side views of various stages of a method for utilizing a sensitizer in a resist to enhance the sensitivity of a resist to lithographic radiation, in accord with some embodiments of the invention.

Embodiments of the present invention are directed to methods and compositions for enhancing the sensitivity of a resist to lithographic radiation. In some exemplary embodiments, an amount of sensitizer material, typically relatively small, having silicon-silicon bonding can be incorporated with a resist formulation to achieve the increased sensitivity. Such embodiments can be particularly utilized in resist formulations (e.g., organic-based resist compositions) that utilize an acid-generator to alter a resist composition's solubility in a selected developer after exposure to lithographic radiation.

As used herein, the term "sensitivity" in the context of resist susceptibility to lithographic radiation refers to the minimum intensity/area of lithographic energy applied to a resist composition that results in a selected state of imaging of the resist composition. Accordingly, a resist that is more "sensitive" requires less intensity in lithographic radiation to achieve the selected state. The selected state can be defined in a variety of manners. For instance, the selected state can be the complete removal of a positive resist composition upon exposure to the applied lithographic energy. For example, one measure of sensitivity is equivalent to the clearing dose, as described in the Experimental Section herein. In another instance, the selected state can be the formation of a pattern on a negative resist consistent with what is imaged thereon by the applied lithographic radiation.

Without necessarily being limited by any particular theory, some embodiments potentially improve acid generation efficiency by creating more acid from each imaging event (e.g., quantum of exposure energy at one or more selected wavelengths) by an acid-generator and/or using the created acid more efficiently in reacting with other components of a resist composition. One technique of accomplishing this is to increase the apparent quantum efficacy of acid generation through sensitization. Sensitization can occur, for example, when energy from lithographic radiation is captured by one molecule and subsequently transferred to an acid-generator. Sensitization generally results in a net increase in acid generation in a resist composition.

In conventional lithographic techniques, a sensitivity-resolution tradeoff exists when attempting to etch small features. For advanced wavelengths such as EUV and maskless electron beam, high throughput can be limited by the amount of photons or electrons available with appropriate energies. Accordingly, an increase in resist sensitivity can directly translate into increased manufacturing throughput and lower per wafer manufacturing cost. The increase in resist sensitivity can relate almost directly in a 1:1 fashion with an increase in semiconductor wafer throughput. Wafer throughput is one of the most significant drivers in predicting lithography cost of ownership and thus directly impacts semiconductor manufacturing cost.

This can be seen in the following basic equation, which can be employed to estimate lithography cost of ownership (CoO).

$$CoO=(F\$+O\$+Y\$)/(L*TPT*Y*U)$$

where CoO is the cost per good wafer out; F$ is fixed costs; O$ is variable cost (operating cost); Y$ is cost due to yield loss; L is the life of the tool; TPT is throughput; Y is composite yield; U is utilization. Fixed costs include purchase, installation and facilities costs that are normally amortized over the life of the equipment. Variable costs such as material, labor, maintenance, utilities and overhead expenses are incurred during equipment operation. Throughput is based on the time to meet a process requirement such as pattern imaging. Composite yield may include breakage, misprocessing, defects and process control scrap losses. Utilization is the ratio of production time compared with total available time. Yield loss cost is a measure of the accumulated manufacturing cost of wafers lost through operational losses and probe yield issues. Yield models are used in CoO calculations for estimating the relationship between contamination and yield loss or scrap. This model relates IC yield to circuit and process parameters such as device geometry, particle density and defect clustering.

It can be readily seen that any increase in throughput will directly result in lower cost of ownership. Accordingly, some embodiments described herein can result in a substantial economic saving for producers of particular devices using lithographic techniques. For instance, use of a sensitizer as described herein can result in a lowering of manufacturing costs from 20% to 50% relative to current manufacturing costs for some processes.

Methods for Enhancing Resist Sensitivity

One exemplary embodiment is depicted in FIGS. 1A-1E, showing stages in a method for enhancing the sensitivity of a resist in the context of etching a semiconductor substrate. As depicted in FIG. 1A, a surface of a substrate 110, such as a silicon wafer, is prepared for processing. Preparation can include particular cleaning, rinsing, drying, and/or other surface treatments such as adding a surface composition to adjust interfacial properties between the substrate and a resist composition. The term "substrate" refers to a material body having a surface typically suitable for application of a composition thereon. In many instances, a substrate can be a portion of an electronic device in which a layer may be deposited thereon, and/or lithographic processes can be conducted therewith. For example, a substrate can be a wafer (e.g., single crystal, polycrystalline, amorphous, etc.) comprising silicon, germanium, gallium arsenide, or other materials including those typically utilized in electronics manufacturing.

Figure 1B:
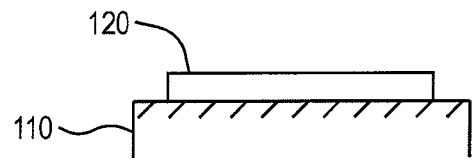

Next, a resist 120 is formed as a layer on the substrate 110 as shown in FIG. 1B. Resists are typically susceptible to change when exposed to a selected lithographic radiation (e.g., the resist is imaged by a pattern of lithographic radiation projected on the surface of the resist). In many instances, the resist includes a sensitizer for increasing the sensitivity of the resist to lithographic radiation. Resists can include a variety of other components such as acid-generators, lithographic radiation-sensitive matrix materials, base additives, and other materials, including those typically utilized by a skilled artisan. A description of some potential components of a resist composition are described herein, and can be applied in any appropriate combination to practice various embodiments as described herein. For example, the resist composition can include a matrix material (e.g., an organic matrix material) which can undergo an acid catalyzed reaction with an acid; an acid generator for creating acid when exposed to a selected level of lithographic radiation; and a sensitizer (e.g., a compound with a silicon-silicon bond) for increasing the sensitivity of the resist composition to lithographic radiation.

Formation of the resist layer can be performed using any number of techniques, including those known to one skilled in the art. In some instances, spin casting techniques can be applied to deposit the resist composition. In some aspects, the thickness of the photoresist layer is less than about 200 nm or about 100 nm. Such photoresist configurations may be advantageous for short wavelength lithography (e.g., less than 200 nm such as 193 nm and/or 157 nm). Thicker layers, however, can also be utilized; for example, the thickness can be less than about 1 micron, less than about 500 nm, 400 nm, or 300 nm. In some embodiments, a post-apply bake (herein "PAB") is performed after the resist is applied to a substrate. A PAB step can act to remove residual solvent in the resist formulation and/or reduce stress in the layer formed. Such a step can be performed by subjecting the substrate and resist layer to a heating apparatus or using any other suitable technique, including those known to one skilled in the art. Types of heating devices include the use of ovens (e.g., air convection, conduction, or infrared), hot plates, and tracks systems.

Some embodiments can add one or more layers on top of the resist 120 and/or located between the resist 120 and the substrate 110. Such additional layers can provide additional features. For example, one or more layers can be disposed on top of the resist 120 to act as a barrier layer to inhibit or prevent contact of substances with the resist 120. For example when liquid immersion lithography is being utilized, the barrier layer can inhibit or prevent resist from solubilizing and intermingling with the liquid, which can potentially contaminate the liquid (thereby changing its optical properties) and/or the lens of the radiation source. Other layers can also act to provide additional features such as changing the optical nature of lithographic radiation incident on the resist, or acting as an adhesion layer.

Figure 1C:
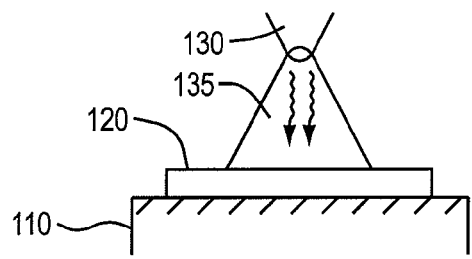

The resist 120 can be imaged by applying lithographic radiation 135 from a source 130 as exemplified in FIG. 1C. The terms "imaging" and "image," as applied to a resist, refer to the process of applying, and the form of, respectively, a selected pattern on the resist by interaction of the resist with lithographic radiation. The phrase "lithographic radiation" refers to the energy medium used to impart a pattern upon a resist composition. In many instances, lithographic radiation can be embodied as electromagnetic radiation of a certain wavelength, or wavelength range, and can be further characterized by a dose (e.g., energy/area) or energy flux. Though any wavelength or wavelength range suitable for imaging a resist composition can be utilized, in some embodiments that utilize a sensitizer the wavelength can be in a range from about 0.1 nm to about 260 nm (or about 140 nm to about 220 nm), and can include one or more short wavelengths (e.g., wavelengths below about 200 nm) such as about 157 nm, or about 193 nm. Higher wavelengths, for example above 200 nm such as 248 nm and/or 365 nm, can also be used. Other electromagnetic radiation ranges include EUV (e.g., about 10 nm to about 20 nm) and/or x-rays (e.g., about 0.1 nm to about 10 nm). Lithography utilizing electromagnetic radiation can be performed in "dry" or "wet" environments. In some embodiments, lithographic radiation can also be embodied by electron beams and/or ion beams.

Lithographic radiation sources for use with some embodiments can include any sources appropriate for generating desired lithographic radiation for selected pattern formation. Such sources can utilize a variety of hardware, including those known to a skilled artisan for producing a desired type of lithographic radiation. For example, krypton fluoride excimer lasers can provide light at about 248 nm, argon fluoride excimer lasers can provide light at about 193 nm, and molecular fluorine lasers can provide light at about 157 nm. Other embodiments can utilize broadband sources or sources that generate a variety of energies and/or wavelengths, which can be followed by the use of a filter to select desired wavelengths or energies.

A selected pattern of lithographic radiation can be any desired geometrical shape, and is typically two-dimensional in character. Processes for imaging a resist include any process capable of delivering the lithographic radiation in a manner suitable for proper image formation. In some instances, the lithographic radiation is applied by exposing the resist to a pattern of lithographic radiation that is similar to the selected pattern for the resist. For example, a mask can be located between the lithographic radiation source and the resist surface. The mask can have regions that preferably allow lithographic radiation penetration, inducing a radiation image on the surface of the resist. In another example, a maskless aerial image pattern is directly projected onto the resist surface, such as utilized in photolithography and/or electron beam lithography. In other instances, the lithographic radiation is applied by scanning the resist, by either moving the target or radiation source or both. Any of these techniques among others, including those known to one skilled in the art, can be utilized to form the selected pattern.

Exposure of a resist composition to lithographic radiation can result in resist imaging by a variety of mechanisms. For example, the portion of a resist exposed to lithographic radiation can result in at least partial bleaching. In embodiments where an acid generator is present in the resist composition, exposure to a selected dose and/or wavelength of lithographic radiation can activate acid creation by the acid generator. For instance, the lithographic radiation can result in an acid-catalyzed reaction of a polymeric matrix material in the resist, e.g., via acid created by the acid generator. The acid creation can be limited spatially to the locality of the resist exposed to the lithographic radiation. Such acid can act to change the character of the resist composition. In some instances, the acid can interact with the matrix material of a resist (e.g., a polymeric material) to make the material more soluble when contacting a developer (e.g., relative to when the material is not exposed to lithographic radiation). In other instances, the acid can interact with a matrix material to make the material more insoluble when contacting a developer (e.g., relative to when the material is not exposed to lithographic radiation). Accordingly, development of a post-exposed resist can result in a pattern transfer to the resist.

In some embodiments, the presence of a sensitizer in the resist composition can enhance the sensitivity of the composition to a selected lithographic radiation condition (e.g., using a wavelength of electromagnetic energy in the range from about 140 nm to about 260 nm or below about 200 nm). For instance, the sensitizer can increase the sensitivity of the resist by at least 1%, 5%, 10%, 25%, 50%, 75%, 100%, 200%, 300%, 400%, 500% or more relative to the resist composition sans the sensitizer.

Without being bound by any particular theory, the enhancement in sensitivity may be achieved via any one of the following mechanisms, or through a combination thereof. Typically, the changes that may be caused by the sensitizer in a resist are relative to a resist sans the sensitizer. In one example, the sensitizer can increase the amount of acid produced in a resist by improving the acid generation efficiency in the resist from an imaging event (e.g., a selected quantum exposure of lithographic radiation), thereby increasing the sensitivity of the resist. For instance, the sensitizer may improve photon and/or electron transfer in the resist, which can accelerate acid generator activation. Such transfer improvement may be achieved by the production of radicals with a high quantum yield, which may accelerate acid generator production of acid. Another example can be the more efficient use of an acid with other components in the resist composition to result in imaging.

In some instances, the presence of a sensitizer in a resist composition can increase the absorbance of the resist (e.g., relative to not having the sensitizer therein) to a selected lithographic radiation (e.g., electromagnetic radiation with wavelengths below about 200 nm). Accordingly, the sensitizer can allow for improved absorption of the selected lithographic radiation, which may improve resist sensitivity, while not making the composition too "opaque," requiring excessive dosages of the lithographic radiation.

In another example, the sensitizer can act to lower the absorbance of the resist by bleaching in the area exposed to lithographic radiation. For instance, the absorbance of the resist can change by at least about 2 $\mu m^{-1}$, at least about 1.5 $\mu m^{-1}$, or at least about 1 $\mu m^{-1}$ between the unexposed resist and some selected exposure level (e.g., at or above about 0.1 mJ/cm2). When the lithographic radiation is embodied as electromagnetic radiation, the wavelength of the radiation can be short (e.g., less than about 200 nm, such as about 193 nm or about 157 nm). In some instances, the change in absorbance (e.g., lowering by at least about 2 $\mu m^{-1}$, at least about 1.5 $\mu m^{-1}$, or at least about 1 $\mu m^{-1}$) can occur without the resist exhibiting negative solubility to a selected developer (e.g., tert-butyl ammonium hydroxide solution). The sensitizer can act to cause a resist composition to "bleach," in some instances, upon exposure to the lithographic radiation. Such bleaching may lead to a sharpening of an image imparted to a resist from an aerial image, such as described in a U.S. patent application bearing Ser. No. 11/534,347, filed Sep. 22, 2006, entitled "Contrast Enhancing Layers," the entire contents of which are incorporated herein by reference.

One or more types of post-exposure treatments can be performed to aid imaging of the resist subsequent to application of the lithographic radiation. For instance, a post-exposure bake (herein "PEB") can be performed on the resist. A PEB can serve one or more functions such as to facilitate progression or termination of a lithographically-induced chemical reaction in the resist. The PEB can be performed using heating equipment, such as described with respect to PAB herein. Other types of post-exposure treatments include radiation exposure, vacuum exposure, and reactive gas exposure.

Figure 1D:
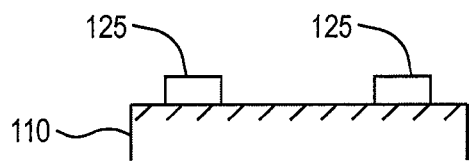

As depicted in FIG. 1D, portions of the resist can be removed to reveal a pattern 125 after completion of resist exposure to lithographic radiation. Removal can be effected by a variety of techniques such as contacting the resist with an appropriate solvent and/or other developer, depending upon the nature of the resist composition. Developers can be a mixture with a base to help dissolve the acid-catalyzed resist composition, which can include hydroxides, amines, and other materials exhibiting a sufficiently high pH to remove the exposed resist. Another potential removal technique entails using a plasma as a developer to remove portions of the resist, which can be useful with resist materials that are substantially cross linked (e.g., silicon containing polymers that have been cross linked by surpassing an energy exposure threshold). In some instances, the developer acts to preferentially remove portions of the resist exposed to selected lithographic radiation. In other instances, the developer acts to preferentially remove portions of the resist that are not exposed to selected lithographic radiation. A post-development bake step can optionally be applied to the resist after resist development.

Figure 1E:
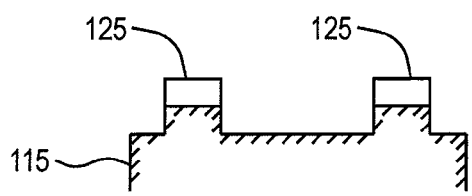

After removal of the exposed resist areas, lithographic step(s) for etching exposed portions of the substrate 110 can be performed to create desired features on the substrate 110 as depicted in FIG. 1E. Such lithographic steps are well understood by those skilled in the art. In some embodiments, the silicon atoms of a sensitizer, which forms part of the resist, can impart improved plasma etch resistance to a resist composition relative to a resist sans the sensitizer. Accordingly, substrate etching can potentially be performed with better performance.

Figure 2:
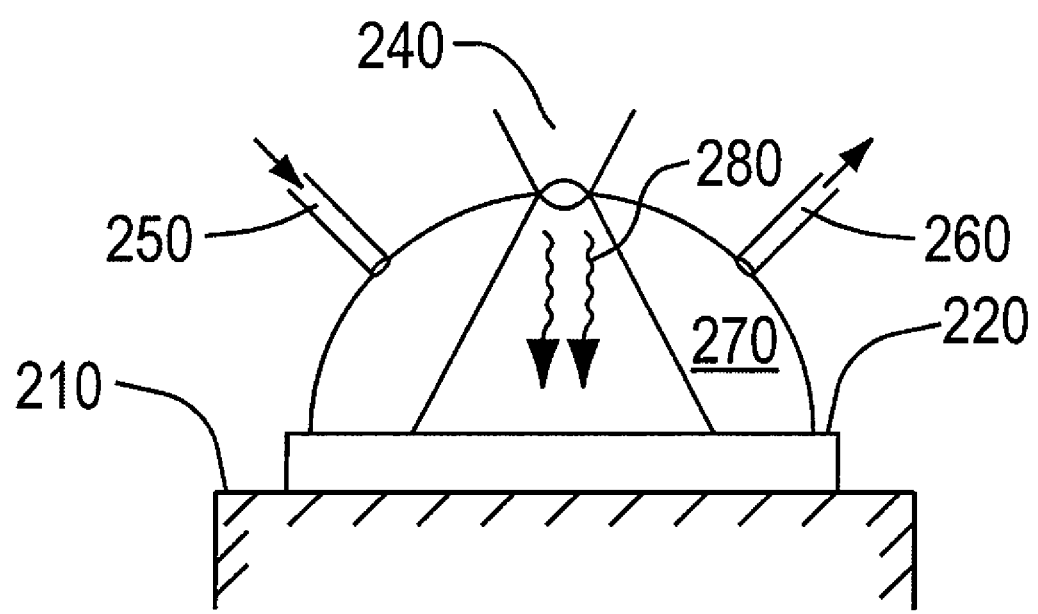
FIG. 2 depicts a side view of a liquid immersion lithography step, in accord with some embodiments of the invention.

Some embodiments are directed to techniques utilizing liquid immersion lithography with one or more aspects of the present invention. As depicted in FIG. 2, a substrate 210 has a resist layer 220 formed thereon. Formation of the resist, which can include a sensitizer, and any other optional layers can be performed in accordance with appropriates steps as discussed herein. A liquid layer 270 can contact a portion of the resist surface 220 (e.g., about 5 cm$^2$ to about 10 cm$^2$) and the radiation source 240. The liquid can be distributed through a outlet port 250 and sucked into an inlet port 260 as depicted in FIG. 2, though other ways of forming and maintaining the liquid layer can also be utilized as understood by those skilled in the art. A pattern can be applied to the resist, e.g., an image projected through the liquid layer 270 and onto the surface of the resist 220 using actinic radiation 280 as shown in FIG. 2. Subsequently, the liquid 270 can be removed, with the exposed sections of the resist also being removed using techniques discussed herein and known to those skilled in the art.

The use of the liquid layer can act to increase the line width resolution achieved by a particular actinic radiation wavelength relative to "dry" lithography. For example, when implemented at about 193 nm, liquid immersion lithography could provide similar resolution as "dry" 157 nm. In dry lithography, the largest numerical aperture (NA) possible is 1.0, which is defined in part by the refractive index of air being 1.0. In liquid immersion lithography, a fluid is introduced between the last optical element and the photoresist. Thus, the NA of the projection optics is effectively increased to above 1.0. For example, the 193 nm refractive index of high-purity water is ~1.44, and this is therefore the upper limit of the NA using water at 193 nm. Viewed another way, the vacuum wavelength of 193 nm is reduced by the refractive index of water to an effective wavelength of 134 nm in the image plane. This value is less than 157 nm, implying that a higher resolution is possible with 193 nm and water immersion than with dry 157 nm. A similar reduction in effective wavelength could be possible employing an liquid immersion lithographic system at 157 nm.

Sensitizer and Resist Related Compositions

Some embodiments are directed to compositions that can be used for generating an acid, for example during lithographic processing. Such compositions can include an acid generator that is capable of creating acid when activated by lithographic radiation; the lithographic radiation can have a selected character (e.g., having a particular energy, wavelength, and/or dosage). The composition can further include a sensitizer, which can be mixed (e.g., substantially uniformly distributed) with the acid generator.

The sensitizer can act to increase the efficiency of acid generation, for example upon activation by the lithographic radiation. Such efficiency enhancement can result in an increase in total acid creation in the composition upon exposure to a selected lithographic radiation, for example relative to a resist having the same composition sans the sensitizer. For example, the presence of the sensitizer in a resist composition can increase the sensitivity by at least about 1%, 5%, 10%, 25%, 50%, 75%, 100%, 200%, 300%, 400%, 500% or more. In many embodiments, the sensitizer can comprise a compound having at least one silicon-silicon bond. Other characteristics of such compositions (e.g., additional components or features of acid generators and/or sensitizers) are disclosed herein. For example, the composition can further include a matrix material such as a polymeric based material which can act as a portion of a resist formulation for use in lithography. Accordingly, it is understood that any one or combination of these features can be combined to provide a composition consistent with some embodiments of the present invention.

Several embodiments of the invention are directed to sensitizers, which can include one or more compounds having a silicon-silicon bond. For instance, such compounds can comprise an organosilicon containing material. Non-limiting examples of sensitizer materials can include polymers, oligomers, and/or non-polymeric materials having one or more silicon-silicon bonds. While numerous descriptions of silicon-silicon bonded materials that can be used in sensitizers are disclosed in the present application, other descriptions of such materials are also revealed in a U.S. patent application bearing Ser. No. 11/534,347, filed Sep. 22, 2006, entitled "Contrast Enhancing Layers."

While not necessarily being bound to any particular theory, it is believed that the sensitizing properties of such materials can be related to the triggering of the oxidation of the silicon-silicon bond by lithographic radiation, as exemplarily depicted by the photooxidation of a polysilane bond shown below:

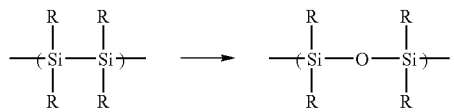

The silicon-silicon bond is highly absorbing at lithographic wavelengths from about 150 nm to about 250 nm (including about 157 nm, about 193 nm, and about 248 nm). For example, at about 193 nm it is believed that many materials having the silicon-silicon bond exhibit an absorbance greater than 10 $\mu m^{-1}$. The silicon-oxygen-silicon bond, however, is believed to have a substantially lower absorbance—somewhere in the neighborhood of about 1 $\mu m^{-1}$ or less. Accordingly, after exposure to an appropriate wavelength of actinic radiation, the sensitizer can undergo a transition from a high-absorbance material to a low absorbing (e.g., relatively transparent) material. This transition can work in conjunction with an acid generator to help increase the sensitivity of a resist, e.g., by increasing the efficiency of acid generation, which can occur by improving lithographic radiation triggering of acid generation.

Particular examples of silicon-silicon bond containing materials that can be utilized in a sensitizer include a variety of polymers, oligomers, and/or other non-polymeric materials. As utilized within the present application, the term "polymer" refers to a molecule comprising repeat units, wherein the number of repeat units in the molecule is 20 or greater. Repeat units can be adjacently connected, as in a homopolymer. The units, however, can be assembled in other manners as well. For example, a plurality of different repeat units can be assembled as a copolymer. If A represents one repeat unit and B represents another repeat unit, copolymers can be represented as blocks of joined units (e.g., A-A-A-A-A-A . . . B-B-B-B-B-B . . . ) or interstitially spaced units (e.g., A-B-A-B-A-B . . . or A-A-B-A-A-B-A-A-B . . . ), or randomly arranged units. In general, polymers include homopolymers, copolymers (e.g., block, inter-repeating, or random), cross-linked polymers, linear, branched, and/or gel networks, as well as polymer solutions and melts. In one embodiment of the invention, the polymer comprises at least a portion of a backbone (linear or branched) having a series of silicon-silicon bonds (e.g., at least 20 silicon atoms bonded adjacent to one another in a linear or branched configuration). Polymers used in various embodiments can have a variety of sizes, though in some embodiments the average molecular weight of the polymer can be below about 5 million, 4 million, 3 million, 2 million, or 1 million daltons.

Embodiments of a composition that can be used as a sensitizer material include a polymer comprising polysilane units. Polysilane units generally have a silicon atom bonded to two other silicon atoms and two non-silicon atoms. One example of a polysilane unit is represented by Structural Formula (I):

the unit being captured between the brackets, where R1 and R2 can each independently be an organic-containing moiety and each silicon atom in the unit is directly covalently bonded to two other silicon atoms. Since R1 and R2 can be independent, each can be a distinct moiety or all occurrences can be the same—either on a particular unit or on some or all of the units, for example. One or more polysilane units can be arranged as a polymer, as previously discussed. For example, units can also be arranged as a copolymer such as poly(phenyl methyl-co-dimethyl silane). Polysilane units can be inter-mixed with other polymeric units that are not related to polysilanes to produce mixed copolymers such as a poly(silane-methylmethacrylate) copolymer. In other instances, the polysilane units of Structural Formula (I) can be adjacent to one another forming a substantial portion of a polymer segment (e.g., homopolymer or copolymer). The number of adjacent units can be in a range from 20 to about 35,000. In other embodiments, the number of adjacent units can be less than about 30,000, 20,000, 10,000, 5,000, 1,000, or 500 repeat units. In some embodiments, the average molecular weight of a polysilane can be less than about 2,000,000 or 1,000,000 daltons, while optionally having a lower limit of at least about 1,000 daltons. Such embodiments can be advantageous since higher molecular weight polysilanes may be more difficult to mix with the other components of a resist to form a workable resist composition.

As previously mentioned, each occurrence of R1 or R2 (herein "RX") is independently an organic-containing moiety. The organic-containing moiety can be aliphatic or aromatic or a combination of both. In one embodiment, RX can be hydrogen or can include 1 to 20 carbon atoms. When RX includes an aliphatic group, the group can be branched or linear or cyclic (e.g., having five, six, seven, or eight members, and being optionally fused to one or more other rings). Non-limiting examples of RX containing an aliphatic group include methyl, ethyl, propyl, butyl, pentyl, hexyl, heptyl, octyl, decyl, dodecyl, and tetradecyl. Such groups can be linear (e.g., n-butyl), branched (e.g., t-butyl or iso-butyl), or cyclic (e.g., cyclohexyl, and methylcyclohexyl). The aliphatic group can be completely saturated, or include one or more units of unsaturation. The aliphatic group can also carry one or more substituents, as described herein. In addition, the group can include one or more positions where a carbon atom is substituted by a heteroatom such as sulfur, nitrogen, or oxygen.

When RX includes one or more aromatic groups, the aromatic group can include carbocyclic aromatic groups such as phenyl, benzyl, tolyl, naphthyl, and anthracyl. Other aromatic groups include heterocyclic aromatics such as imidazoyl, thienyl, furanyl, pyrrolyl, pyridyl, pyrimidyl, pyridazinyl, pyrazolyl, pyrazinyl, thiazolyl, tetrazoylyl, and oxazolyl. Aromatic groups can also include fused polycyclic aromatic ring systems in which a carbocyclic aromatic ring or heteroaryl ring is fused to one or more other rings, either aromatic or non-aromatic (e.g., carboalkyl or heterocyclic). Examples include tetrahydronaphthyl, 2-benzothienyl, 3-benzothienyl, 2-benzofuranyl, 3-benzofuranyl, 2-indolyl, 3-indolyl, 2-quinolinyl, 3-quinolinyl, 2-benzothiazolyl, 2-benzooxazolyl, 2-benzimidazolyl, 1-isoquinolinyl, 1-isoindolyl, 3-isoindolyl, acridinyl, 3-benzisoxazolyl, and the like. As well, multiple aromatic groups can be used in RX (e.g., RX can include a biphenyl group). Any of the aromatic groups previously described can also include one or more substituents as described herein. Furthermore, aromatic groups can be connected to a silicon backbone via an aliphatic group, as described above (e.g., the aliphatic group can be a saturated linear, branched, or cyclic hydrocarbon having 1 to 10 carbon atoms such as a phenylethyl group).

In general, one or more substitutions can be included with any particular RX group. Non limiting examples of organic functional groups that can act as substitutions include acetal, acyl halide, alcohol, aldehyde, alkane, alkene, alkyne, alkoxy, amide, amine, ammonium, arene, azide, heteroarene, azide, carboxylic acid, disulfide, epoxide, ester, ether, fluoroalcohol, halide (including fluorine, chlorine, bromine, and iodide), ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, or thiol. Substituents can also be multifunctional, such as being a halo-substituted alcohol (e.g., fluoroalcohol) or a halo-substituted alkyl (e.g., trifluoropropyl and nonafluorohexyl).

RX can also contain an acid labile protecting group, which when removed generates an acidic proton. Examples include carboxylic acids, phenol, and fluoroalcohols.

The choice of RX can alter the properties of the sensitizer in terms of its processing and/or its action when exposed to lithographic radiation. For example, the use of RX groups where RX includes an aliphatic or aromatic carboxylic or sulfonic acid containing group can be advantageous for forming a resist having desirable solubility in basic developers. Other choices for RX affect the bleaching properties of a resist composition in which the sensitizer is included. In one embodiment, more than half the bonding in a RX moiety, or substantially all of the moiety, is aliphatic. Such an embodiment can be useful for lithography using actinic radiation including a wavelength of 193 nm since such materials can exhibit low residual absorbance after energy exposure. In another embodiment, more than half the substitutions of a RX moiety, or substantially all of the RX moieties, are fluoroaliphatic. Such an embodiment can be useful for lithography owing to low residual absorbance after exposure to actinic radiation including 157 nm wavelength radiation. Accordingly, substitutions of RX groups can include fluoroaliphatic groups in some embodiments that can be used with actinic radiation including 157 nm wavelength.

Another type of polysilane unit is represented by Structural Formula (IIa):

(IIa)

where R is defined as described herein for R1 or R2 with respect to Structural Formula (I), each silicon atom in the unit is covalently bonded to two other silicon atoms, and A is a covalent bond or a bivalent organic connecting group. Bivalent connecting groups include alkylidenes (e.g., methylidene, ethylidene, and isopropylidene), alkylenes (e.g., ethylene, propylene, and triethylene), and arylenes (e.g., phenylene, biphenylene and naphthylene). These types of polysilane units are discussed in U.S. Pat. No. 6,025,117, the entire contents of which is incorporated herein by reference. More generally, such units can be described by Structural Formula (IIb):

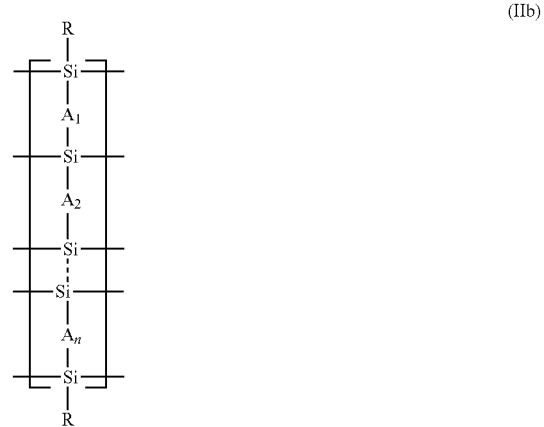

(IIb)

wherein each silicon atom in the unit is covalently bonded to two other silicon atoms, each of $A_1, A_2, \ldots A_n$ is independently a bivalent connector group as described for Structural Formula (IIa), and each R is independently a group as described for R1 or R2 in Structural Formula (I). n can range from 1 to 10, or more preferably from 1 to 3.

Non-limiting examples of polysilanes include those described in Miller, R. D. et al., Polysilane High Polymers, *Chem. Rev.* 1989, Vol. 89, 1359-1410, which is hereby incorporated herein by reference in its entirety. Some specific polysilanes include those including repeat units according to Structural Formula (I), where one R1 is methyl and R2 is one of n-Pr, Ph-$C_2H_4$, n-Bu, n-Hex, n-dodecyl, c-Hex, Ph, p-tolyl, p-t-butyl $C_6H_4$, 2,4,5Me$_3C_6H_2$, p-MeO$C_6H_4$, p-n-$C_8H_{17}OC_6H_4$, 3-OHC$_6H_4$CHMeCH$_2$, p-MeO$C_6H_4(CH_2)_3$, p-Me$_2$N$C_6H_4$, p-(tetramethylsilyl)$C_6H_4$, p-(tetramethylsilyl)CH$_2C_6H_4$, 2-3(3-cyclohexenyl)ethyl), β-naphthyl, p-biphenyl, cyclohexyl. Other polysilanes include units according to Structural Formula (I) where both R1 and R2 groups of a unit are at least one of n-Pr, n-Bu, n-pentyl, n-Hex, n-heptyl, n-octyl, n-decyl, n-dodecyl, n-tetradecyl, p-n-Bu-$C_6H_4$, p-n-Hex-$C_6H_4$, p-i-Bu-$C_6H_4$, m-n-Hex $C_6H_4$, p-n-BuO—$C_6H_4$, or m-n-BuO—$C_6H_4$. Still other polysilanes include units having Structural Formula (I) where R1 and R2 are one of the entries in the table below.

| R1 | R2 |
|---|---|
| hydrogen | phenyl |
| p-n-Bu—$C_6H_4$ | p-n-BuO—$C_6H_4$ |
| p-n-BuO—$C_6H_4$ | m-n-BuO—$C_6H_4$ |

Another embodiment of a composition that can be used as a sensitizer is a polymer comprising polysilyne units. A polysilyne unit can have a chemical structure represented by Structural Formula (III):

(III)

where each occurrence of R is independently an organic-containing moiety and each silicon atom of the unit is covalently bonded to three silicon atoms. R can include any of the groups described for R1 or R2 in Structural Formula (I). As well, a polymer that comprises polysilyne units can include homopolymers, copolymers (e.g., mixing different polysilyne units such as units having R=iso-butyl with units having R=n-propyl, and/or polysilyne units with other silicon-containing or non-silicon-containing units), etc. as previously described. In some instances, the polysilyne units of Structural Formula (III) can be located adjacent to one another to form a portion of a homopolymer or copolymer; the number of adjacent polysilyne units can range from 20 to about 5,000. In other embodiments, the number of adjacent polysilyne units can be less than about 3000, 2000, 1000, 750, 500, 400, 300, 200, 100, 90, 80, 70, 60, or 50. In some embodiments, the average molecular weight of a polysilyne polymer can range from about 1,000 to about 200,000 daltons. In other embodiments, the upper limit of the average molecular weight of a polysilyne can be about 100,000 daltons, 90,000 daltons, 80,000 daltons, 70,000 daltons, 60,000 daltons or 50,000 daltons. Such embodiments can be advantageous in some instances since larger average molecular weight polysilynes can be difficult to manufacture with respect to terminating the polymerization reaction during polysilyne synthesis.

Examples of polysilynes include those described in U.S. Pat. No. 4,921,321; Kunz, R. R. et al., Polysilyne resists for 193-nm excimer laser lithography, *SPIE Advances in Resist Technology and Processing VIII* 1991, Vol. 1466, 218-26; Kunz, R. R. et al., Photo-oxidation of σ-conjugated Si—Si network polymers, *J. Vac. Sci Technol. A* May/June 1991, Vol. 9(3) 1447-51; all of which are hereby incorporated herein by reference in their entirety. Specific examples of polysilyne units include units conforming to having R be n-propyl, iso-propyl, n-butyl, iso-butyl, t-butyl, n-hexyl, cyclohexyl, amyl, or phenyl. As well, an exemplary copolymer can utilize two or more types of the polysilyne units previously mentioned (e.g., 70% of the units having R=phenyl and 30% of the units having R=n-hexyl, as taught in U.S. Pat. No. 5,426,160, which is hereby incorporated herein by reference in its entirety).

Non-polymeric organosilicon containing materials can also be used as a sensitizer material, consistent with some embodiments of the invention. Previous work on polysilane photochemistry demonstrated that the absorptivity of a Si—Si bond drops as the molecular weight of the polymer falls. However, it was surprisingly found that small, non-polymeric organosilicon containing materials can have substantial absorptivity of actinic radiation before the onset of photobleaching, and have been shown to be an effective sensitizer material as described in some of the examples herein.

As used throughout the present application, the phrase "non-polymeric" includes all materials that are not considered polymers. Oligomers are one example of a non-polymeric material. As used throughout the present application, "oligomers" are molecules formed from a plurality of repeat units, wherein the number of units is in the range from 2 to 19. The repeat units can be adjacently bonded to one another. As well, like a polymer, the oligomer can utilize two or more distinct repeat units that can be arranged in a variety of manners. Other types of non-polymeric materials include the range of typical small molecule organosilicon materials such as cyclic or bicyclic silane molecules.

Non-polymeric materials that can be used as sensitizers can include a backbone comprising silicon atoms that can be contiguously bonded or bonded in fragmented portions. In general, the geometry of the backbone is not limited; in particular embodiments, it can be linear, cyclic (e.g., bicyclic structure), and/or branched (e.g., an oligomer of a polysilyne). In one embodiment, the silicon backbone comprises two or more silicon atoms bonded to form a non-interrupted silicon backbone. For example, the non-interrupted silicon backbone can have a structure given by Structural Formula (IV):

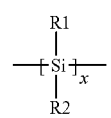
(IV)

wherein R1 and R2 are each independently an organic-containing moiety; each silicon atom of the unit is covalently bonded to two other silicon atoms; and x is an integer in the range of 2 to 19 (inclusive). R1 and R2 can be any of the groups as described with respect to Structural Formula (I). The structure of the molecule can include a linear silicon chain, such as appears in an oligomer of a linear polysilane. The structure can also be cyclic such as found in cyclic silanes (e.g., dodecamethylcyclohexasilane). Other types of silicon-containing repeat units can also be used to form non-polymeric organosilicon materials. Non-limiting examples include repeat units such as shown in Structural Formula (IIa) and/or (IIb), having a total number of repeat units to be an oligomer. As well, beyond polysilane-like units, other types of polymeric units can be utilized to form an oligomer such as silynes, and other silicon-containing molecules. Mixtures of the different types of oligomers can also be utilized. For example, silynes can utilize a plurality of repeat units where the lower repeat unit value can be about 5, and the upper repeat value can be any integer between about 10 and 19. Furthermore, non-polymeric organosilicon materials need not include an oligomer. Indeed, other molecular materials having silicon-silicon bonding such that the molecular structure lacks periodicity can also serve as a non-polymeric organosilicon material.

The phrase "acid-generator" refers to one or more compounds which can generate an acid when exposed to a selected lithographic radiation. For example, an acid generator for use in a composition disclosed herein can respond to electromagnetic wavelengths such as 248 nm, 193 nm, 157 nm, EUV, and/or x-rays; e-beams (high or low voltage e-beam); and/or ion beams. The acid generator can also be soluble in an acid-generating composition (e.g., a resist) or in an organic solvent. Preferably, a mixture of the acid-generator along with the other components of a resist composition can be suitable for spin coating. Compositions consistent with embodiments of the invention can include an acid-generator at levels between about 0.01% and about 50%, more preferably between about 0.5% and about 20%, and most preferably between about 1.0% and about 10%, based on the total weight of a resist composition.

Examples of suitable acid generators include onium salts, such as di phenyliodonium salts, triphenylsulfonium salts, sulfonium salts, iodonium salts, diazonium salts and ammonium salts, nitrobenzyl esters such as 2,6-nitrobenzylesters, hydroxamic acid esters, phloroglucinol sulfonates, diazosulfonates, 1,2,3-tri(methanesulfonyloxy)benzene, sulfosuccinimides and lithographically-sensitive organic halogen compounds as disclosed in Japanese Examined Patent Publication No. 23574/1979.

Examples of diphenyliodonium salts include diphenyliodonium triflate (DPI-105, Midori Kagaku Co. Ltd.), di-t-butylphenyl iodonium perfluorobutyl sulfonate (Toyo Gosei Kogyo Co., Ltd.), and diphenyliodonium tosylate (DPI-201, Midori Kagaku Co. Ltd.). Examples of suitable bis(4-tert-butylphenyl)iodonium salts include bis(4-tert-butylphenyl) iodonium triflate (BBI-105, Midori Kagaku Co. Ltd.), bis(4-tert-butylphenyl)iodonium camphorsulfate (BBI-106, Midori Kagaku Co. Ltd.), bis(4-tert-butylphenyl)iodonium perfluorbutylate (BBI-109, Midori Kagaku Co. Ltd.) and bis (4-tert-butylphenyl)iodonium tosylate (BBI-201, Midori Kagaku Co. Ltd.). Suitable examples of triphenylsulfonium salts include triphenylsulfonium hexafluorophosphite (TPS-102, Midori Kagaku Co. Ltd.), triphenylsulfonium triflate (TPS-105, Midori Kagaku Co. Ltd.), triphenylsulfonium perfluorobutylate (TPS-109, Midori Kagaku Co. Ltd.), and triphenylsulfonium perfluorobutyl sulfonate (Toyo Gosei Kogyo Co., Ltd.).

Specific examples of lithographically-sensitive organic halogen compounds include halogen-substituted paraffinic hydrocarbons such as carbon tetrabromide, iodoform, 1,2,3, 4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing triazines such as tris(trichloromethyl)-s-triazine, tris(tribromomethyl)-s-triazine, tris(dibromomethyl)-s-triazine, perhalomethyl triazines, and 2,4-bis(tribromomethyl)-6-methoxyphenyl-s-triazine; halogen-containing benzenes such as (bis (trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such lithographically-sensitive organic halogen compounds, a bromine-containing compound, such as bromobisphenol A, can also be utilized.

In some embodiments, compositions for generating an acid can be formulated in a resist composition (e.g., a resist composition that is organic in character). Accordingly, a resist composition can include an acid generator and a sensitizer, as described throughout the present application, and can further include a matrix material. In many instances, the matrix material and the acid generator, in the absence of the sensitizer, can act as a typical resist composition. The matrix material can be capable of undergoing an acid catalyzed reaction when the resist composition is exposed to a selected lithographic radiation. For example, the matrix material can bleach and/or become more soluble upon contacting a developer in the locality exposed to the lithographic radiation. An acid catalyzed reaction can result from the removal of acid-labile groups from a matrix material, allowing the acid to make the matrix material more soluble in a base developer. Acid catalyzed reactions, however, can also result from other changes in the matrix material from acid exposure as well. In some instances, the matrix material can be sensitive to certain wavelengths of electromagnetic radiation such as short wavelength radiation (e.g., wavelengths below about 260 nm, 200 nm, or 160 nm). For example, when performing lithography at 193 nm, commercially available matrix materials such as polymethacrylate compositions available from Rohm and Haas Electronic Materials, Fuji Photo Film, AZ Electronic Materials, Tokyo Ohka Kogyo Co., JSR Micro, Shin-Itsu MicroSi, and Sumitomo Chemical can be utilized.

Various types of matrix materials can be used with resist compositions herein. In many embodiments, the matrix materials are polymeric and/or organic-based materials. Examples of polymers include poly(methacrylate)-based polymers (e.g., poly(adamantyl) methacrylates), poly(acrylate)polymers, polystyrene (e.g., polyhydroxystyrene), polyfluorocarbons, polyfluoroalcohols, and copolymers of any combination of these. In some embodiments, the matrix material does not include substantial silicon-silicon atom bonding in the matrix material, and/or does not include silicon atoms anywhere in the matrix material, and/or does not have a large absorbance at a particular wavelength or wavelength range of interest (e.g., below 200 nm such as about 193 nm or about 157 nm). For example, the absorption of the matrix material can be less than about 50%, or less than about 20%, or less than about 10%, of the absorption on a basis of the whole resist composition, and/or on a weight basis with the sensitizer.

In embodiments in which a resist composition includes matrix material, an acid generator, and a sensitizer, the sensitizer can constitute a small fraction of the total amount (e.g., weight) of the three components. For instance, the sensitizer can be less than about 20%, 15%, 10%, 5%, 3%, 1%, 0.5%, or 0.1% of the weight of the three components. In another instance, the sensitizer can be less than about any of the previously cited percentages of the total weight of a resist composition. In other instances, the sensitizer can constitute a percentage between about 0.01% and any of the previously recited values of the entire weight of the resist composition or of the combination of sensitizer, acid generator, and matrix material.

Resist compositions can be applied to form a thin resist layer on a substrate. Accordingly, in some embodiments, the resist composition is formulated as a layer on a substrate having a selected thickness appropriate for performing a particular lithographic step. In some embodiments, the resist layer has a thickness less than about 1000 nm, 500 nm, 400 nm, 300 nm, 200 nm or 100 nm.

In other embodiments, the matrix material of a resist composition can be selected such that the resist exhibits additional, or alternative, properties. Other compositions can also be added beyond the matrix material to provide one or more of the properties discussed herein. In some embodiments, a resist composition can utilize a matrix material, or other composition, to enhance the film forming properties of the resist (e.g., quicker drying times, striation-free film formation, and/or suppression of cross-linking). Film-forming polymers can be used with any of the resist compositions discussed within the present application, such as with particular non-polymeric sensitizer materials to enhance film formation of the resist.

In some embodiments, a matrix material, or other composition, can increase or maintain the solubility of a resist composition being applied and/or being removed that includes sensitizer. For example, the composition can inhibit cross-linking of the sensitizer to thereby improve the solubility properties of the resist during development. Some sensitizers, such as polysilanes, can cross-link after energy exposure at a particular wavelength crosses a particular threshold. In such an instance, removal of the resist can be inhibited as portions of the resist can be rendered insoluble by the cross-linking reaction. An appropriate composition additive can act to elevate the energy exposure level at which cross-linking is initiated. These embodiments can also be applied to other sensitizers such as polysilynes (e.g., use of a low polarity polymer such as poly(t-butyl methacrylate)), and even the non-polymeric compositions, the latter perhaps polymerizing and subsequently cross-linking upon extended energy exposure.

Compositions consistent with embodiments of the present can also include a variety of other components that provide additional features. Solvents and other components (e.g., viscosity control agents or surfactants) are optionally included to provide properties such as facilitating spin-coating and/or film formation in a resist. In some embodiments, one or more components can be added to a resist, acid generating composition, or other composition to increase the oxygen content of the composition relative to not having the components therein. For example, a polymer can be added to enhance the amount of alcohol, water, or oxygen in the composition to act as a source of oxygen to promote oxidation of the sensitizer upon activation by actinic radiation. Candidate polymers include hydroxyl or carboxylic acid containing polymers. In another example, component(s) can act to increase the water or oxygen permeability of the composition relative to not having the component(s) therein. Permeability enhancing components can include polymers having favorable oxygen and/or water permeability such as polysiloxanes, fluoropolymers, and fluorosiloxane polymers. In an alternative embodiment, component(s) can act to inhibit water permeability in the composition relative to not having the component(s) therein. In such an instance, the component(s) can act to help prevent water, or some other aqueous solution, in an immersion lithography context from contacting the resist composition.

Some embodiments include the use of a base additive (e.g., base generator) along with an acid generator to moderate acid production in a composition (e.g., resist). The base additive can be added in any workable amount to the resist composition (e.g., about 0.01 to about 0.9 weight fraction of the resist composition). If only an acid generator is present, in some situations acid can continually form during exposure until the acid generator is completely consumed or the exposure ends. However, if an appropriately tailored base additive is also included, the total acid concentration can be modulated as a function of dose to a desired level resulting in selected resist dissolution characteristics of a resist. In some instances, a relatively higher level of base additive is present in a resist composition (e.g., greater than about 0.2, or greater than about 0.4 weight fraction of the resist composition) to help improve the line width resolution that can be achieved with the resist. Such elevated base additive levels, however, result in a decrease in resist sensitivity. Accordingly, the addition of a sensitizer can improve the sensitivity of the resist (e.g., back to levels with lower base additives or even higher). Examples of base additives include hydroxides (e.g., tetrabutyl ammonium hydroxide), amines (e.g., trioctylamine) including primary, secondary tertiary and quaternary, and other additives capable of raising the pH of a composition including those known to one skilled in the art. Suitable organic bases include, but are not limited to, tetramethylammonium hydroxide, tetrabutylammonium hydroxide, tetraethanol ammonium hydroxide, 1,4-diazabicylo[2.2.2]octane, 1,5-diazabicyclo[4.3.0]non-5-ene, diazabicyclo[5.4.0]undec-7-ene, triphenyl amine, diphenyl amine, trioctyl amine, triheptyl amine, hexamethylenetetramine, hexamethylenetriethylenetetramine, N-diethyl-N'methylenediamine, 4-aminophenol, 1-piperidineethanol, and 2-(4-aminophenyl)-2-(4-hydroxyphenyl) propane.

Other embodiments of the present invention are directed to kits for forming a composition, which can potentially be used in lithographic processes. In some embodiments, the kit includes one or more of the components of a resist composition as described in the present application. The components of the kit can include any combination of the potential parts of a resist composition, in any of the dispositions discussed herein. As well, a kit can package the components in any potential of combinations. Accordingly, a kit can package the components separately, or can combine any number of the components into units, or combine all components into a single unit.

For instance, some exemplary embodiments are drawn to kits that can be used to formulate a resist composition. The kit can include an acid generator for creating an acid when the formulated resist is exposed to lithographic radiation. A sensitizer is also present for increasing the sensitivity of the formulated resist composition, the sensitizer including a compound having at least one silicon-silicon bond. The sensitizer can increase acid creation in a composition formed from the components of the kit upon exposure to a selected lithographic radiation (e.g., relative to the kit components sans the sensitizer). The kit can also include a matrix material (e.g., a polymeric material) capable of undergoing an acid catalyzed reaction with an acid formed by the acid generator. The specific types of acid generator, sensitizer, and matrix materials in a kit can include any of the materials with any of the features disclosed in the present application. For example, the sensitizer can include one or more of a polysilane, a polysilyne, and a non-polymeric silicon-containing composition. As well, the kit can include other components as well, such as a base additive.

The proportions of the acid generator, matrix material, and sensitizer can be any that can result in a workable resist for a lithographic application. In some embodiments, the sensitizer can comprise less than about 0.20 or 0.10 weight fraction of the total weight of the acid generator, matrix material and sensitizer. In other embodiments, the sensitizer can comprise between about 0.001 and about 0.20, or between about 0.005 and about 0.10, weight fraction of the total weight of the acid generator, matrix material and sensitizer. As well, the kit can be compartmentalized (i.e., portions being materially isolated from other portions) in any fashion with respect to the kit's components. For example, the sensitizer, acid generator, and matrix material can each be separately compartmentalized, or at least two of the components can be compartmentalized together.

EXAMPLES

The following examples are provided to illustrate some embodiments of the invention. The examples are not intended to limit the scope of any particular embodiment(s) utilized.
Experimental Description
Resist Materials Poly(4-hydroxystyrene-co-t-butyl acrylate) (herein "HOST-TBA") was obtained from DuPont Electronic Materials, and was prepared from a 60:40 charge ratio of 4-hydroxystyrene to t-butyl acrylate. Poly(2-ethyl-2-adamantanol methacrylate-co-gamma-butyrolactone methacrylate-co hydroxyadamantane methacrylate) (herein "EAdMA-GBLMA-HadMA") was obtained from DuPont Electronic Materials, and was prepared from either a 23:58:19 or a 31:52:19 charge ratio of 2-ethyl-2-adamantanol methacrylate to gamma-butyrolactone methacrylate to hydroxyadamantane methacrylate. Poly(2-methyl-2-adamantanol methacrylate-co-gamma-butyrolactone methacrylate) (herein "MAdMA-GBLMA") was obtained from AZ Electronic Materials, and was prepared from a 50:50 charge ratio of 2-methyl-2-adamantanol methacrylate to gamma-butyrolactone methacrylate.

The photoacid generators (herein "PAGs") employed, di-t-butylphenyl iodonium perfluorobutyl sulfonate (herein "TBPI-PFBS") and triphenylsulfonium perfluorobutyl sulfonate (herein "TPS-PFBS") were obtained from Toyo Gosei Kogyo Co, LTD. The base additive employed, tetrabutyl ammonium hydroxide (herein "TBAH") and trioctylamine (TOA) were obtained from Aldrich Chemical.

Dodecamethylcyclohexasilane (herein "CHS") and was purchased from Aldrich Chemical. Poly(cyclohexylsilyne) (herein "PCHSi") was prepared by the method described in Thomas, W. J., et al., J. Appl. Phys. 96, 6313 (2004); this reference is hereby incorporated herein by reference in its entirety. Cyclohexanone was purchased from Aldrich Chemical. Irgacure 184 (1-Hydroxy-cyclohexyl-phenyl-ketone), Irgacure 651 (2,2-dimethoxy-2-phenylacetophenone), and Irgacure 819 (bis(2,4,6-trimethylbenzoyl)-phenylphosphineoxide) were obtained from Ciba Specialty Chemicals.
General Lithography Process Conditions The post apply bake (herein "PAB") was performed by placing the silicon wafer on a hot plate for the desired time and at the desired temperature. The post exposure bake (herein "PEB") was performed by placing the silicon wafer on a hot plate for the desired time and at the desired temperature. Development of the resist was performed with aqueous tetramethyl-ammonium based commercial resist developers.

The clearing dose (herein "$E_0$") is the lowest exposure dose required to remove all resist after development. $E_0$ was determined by either fitting a line through all points containing less then 80% normalized film thickness as a function of dose and determining the intercept for zero remaining film thickness. If no slope could be determined, $E_0$ is obtained by noting the lowest exposure dose for which no resist remained. The resist contrast (herein "γ") was determined by fitting a line through all points containing less then 80% normalized film thickness as a function of the log of dose, and determining the absolute value of the slope. The unexposed film thickness loss (herein "UFTL") was determined by subtracting the film thickness of an unexposed portion of the resist after development from the film thickness of the resist prior to exposure.

Contrast curves at about 157-nm, 193-nm, or 248-nm were performed on a laboratory-class projection system employing a $F_2$, ArF or KrF laser, respectively. Contrast curves at 248-nm, where noted, were also performed on a Canon FPA-3000EX4 0.60 NA 248-nm stepper. Contrast curves for electron beam were performed on JEOL JBX6000FS at 50 KeV. The optical resolution was determined by exposing the resist with a Canon FPA-3000EX4 0.60 NA 248-nm stepper through a binary chrome-on-quartz mask containing equal pitch features starting at 250 nm and decreasing by steps of 10 nm. The resolution was determined by noting the smallest feature that printed. The electron beam resolution was determined by exposing the resist with a JEOL JBX6000FS at 50 KeV at equal pitch features starting at 250 nm and decreasing by steps of 10 nm. The resolution was determined by noting the smallest feature that printed.
Preparation of Resist Compositions Resist compositions were prepared as described in the various preparations described herein. "Parts" of each component of the resist as described herein correspond with a relative weight amount of the component. For example, a composition of x parts of component A, y parts of component B, and z parts of component C can be formulated by taking any weight basis (e.g., grams, pounds, ounces, etc.) and multiplying the basis by x, y, and z, respectively, to obtain the absolute weight amounts of A, B, and, C, respectively, in the composition.

Example 1

Preparation of EAdMA-GBLMA-HAdMA Based Acid Catalyzed Resist

Resists were prepared by adding 900 parts of cyclohexanone, 4 parts of PAG, and 0.4 parts of TBAH, to an amount of CHS (sensitizer) and 23:58:19 EAdMA-GBLMA-HadMA in quantities as listed in the table below to make an approximately 10.0% weight of solids to total weight solution. The solution was rolled over night and filtered through a 0.2 μm filter. For resists exposed at 157-nm, an additional 1850 parts of cyclohexanone was added and then filtered through a 0.2 μm filter.

| Resist | Parts Sensitizer | Parts Polymer | Polymer | PAG |
|---|---|---|---|---|
| 25011 | 0 | 96 | EAdMA-GBLMA-HAdMA | TBPI- PFBS |
| 25027 | 1 | 95 | EAdMA-GBLMA-HAdMA | TBPI- PFBS |
| 25020 | 2 | 94 | EAdMA-GBLMA-HAdMA | TBPI- PFBS |
| 25021 | 4 | 92 | EAdMA-GBLMA-HAdMA | TBPI- PFBS |
| 25028 | 7 | 89 | EAdMA-GBLMA-HAdMA | TBPI- PFBS |
| 25029 | 10 | 86 | EAdMA-GBLMA-HAdMA | TBPI- PFBS |

Example 2

Preparation of EAdMA-GBLMA-HAdMA Based Acid Catalyzed Resist

Resists were prepared by adding 900 parts of cyclohexanone, 4 parts of PAG, and 0.4 parts of TBAH, to an amount of CHS (sensitizer) and 23:58:19 EAdMA-GBLMA-HadMA in quantities as listed in the table below to make an approximately 10.0% weight of solids to total weight solution. The solution was rolled over night and filtered through a 0.2 μm filter.

| Resist | Parts Sensitizer | Parts Polymer | Polymer | PAG |
|---|---|---|---|---|
| 25013 | 0 | 96 | EAdMA-GBLMA-HAdMA | TPS-PFBS |
| 25067 | 0.1 | 95.9 | EAdMA-GBLMA-HAdMA | TPS-PFBS |
| 25068 | 0.2 | 95.8 | EAdMA-GBLMA-HAdMA | TPS-PFBS |
| 25069 | 0.4 | 95.6 | EAdMA-GBLMA-HAdMA | TPS-PFBS |
| 25070 | 0.7 | 95.3 | EAdMA-GBLMA-HAdMA | TPS-PFBS |
| 25030 | 1 | 95 | EAdMA-GBLMA-HAdMA | TPS-PFBS |
| 25022 | 2 | 94 | EAdMA-GBLMA-HAdMA | TPS-PFBS |
| 25023 | 4 | 92 | EAdMA-GBLMA-HAdMA | TPS-PFBS |
| 25031 | 7 | 89 | EAdMA-GBLMA-HAdMA | TPS-PFBS |
| 25032 | 10 | 86 | EAdMA-GBLMA-HAdMA | TPS-PFBS |

Example 3

Preparation of MAdMA-GBLMA Based Acid Catalyzed Resist

Resists were prepared by adding 900 parts of cyclohexanone, 4 parts of PAG, and 0.4 parts of TBAH, to an amount of CHS (sensitizer) and EAdMA-GBLMA in quantities as listed in the table below to make an approximately 10.0% weight of solids to total weight solution. The solution was rolled over night and filtered through a 0.2 μm filter.

| Resist | Parts Sensitizer | Parts Polymer | Polymer | PAG |
|---|---|---|---|---|
| 25033 | 0 | 96 | MAdMA-GBLMA | TBPI- PFBS |
| 25034 | 1 | 95 | MAdMA-GBLMA | TBPI- PFBS |
| 25035 | 2 | 94 | MAdMA-GBLMA | TBPI- PFBS |
| 25036 | 4 | 92 | MAdMA-GBLMA | TBPI- PFBS |

Example 4

Preparation of EAdMA-GBLMA-HAdMA Based Acid Catalyzed Resist

Resists were prepared by adding 900 parts of cyclohexanone, 4 parts of PAG, and 0.4 parts of TBAH, to an amount of PCHSi (sensitizer) and 23:58:19 EAdMA-GBLMA-HAdMA in quantities as listed in the table below to make an approximately 10.0% weight of solids to total weight solution. The solution was rolled over night and filtered through a 0.2 μm filter.

| Resist | Parts Sensitizer | Parts Polymer | Polymer | PAG |
|---|---|---|---|---|
| 25011 | 0 | 96 | EAdMA-GBLMA-HAdMA | TBPI- PFBS |
| 25041 | 1 | 95 | EAdMA-GBLMA-HAdMA | TBPI- PFBS |
| 25042 | 2 | 94 | EAdMA-GBLMA-HAdMA | TBPI- PFBS |
| 25043 | 4 | 92 | EAdMA-GBLMA-HAdMA | TBPI- PFBS |
| 25013 | 0 | 96 | EAdMA-GBLMA-HAdMA | TPS-PFBS |
| 25044 | 1 | 95 | EAdMA-GBLMA-HAdMA | TPS-PFBS |
| 25045 | 2 | 94 | EAdMA-GBLMA-HAdMA | TPS-PFBS |
| 25046 | 4 | 92 | EAdMA-GBLMA-HAdMA | TPS-PFBS |

Example 5

Preparation of EAdMA-GBLMA-HAdMA Based Acid Catalyzed Resist

Resists were prepared by adding 900 parts of cyclohexanone, 4 parts of PAG, and 0.5 parts of TOA, to an amount of CHS (sensitizer) and 31:52:19 EAdMA-GBLMA-HadMA in quantities as listed in the table below to make an approximately 10.0% weight of solids to total weight solution. The solution was rolled over night and filtered through a 0.2 μm filter. For resists exposed at 157-nm and additional 1850 parts of cyclohexanone was added and then filtered through a 0.2 μm filter.

| Resist | Parts Sensitizer | Parts Polymer | Polymer | PAG |
|---|---|---|---|---|
| 25136 | 0 | 96 | EAdMA-GBLMA-HAdMA | TBPI- PFBS |
| 25166 | 0.1 | 95.1 | EAdMA-GBLMA-HAdMA | TBPI- PFBS |
| 25165 | 0.2 | 95.8 | EAdMA-GBLMA-HAdMA | TBPI- PFBS |
| 25164 | 0.4 | 95.6 | EAdMA-GBLMA-HAdMA | TBPI- PFBS |
| 25163 | 0.7 | 95.3 | EAdMA-GBLMA-HAdMA | TBPI- PFBS |
| 25162 | 1 | 95 | EAdMA-GBLMA-HAdMA | TBPI- PFBS |
| 25137 | 2 | 94 | EAdMA-GBLMA-HAdMA | TBPI- PFBS |
| 25138 | 4 | 92 | EAdMA-GBLMA-HAdMA | TBPI- PFBS |
| 25161 | 7 | 89 | EAdMA-GBLMA-HAdMA | TBPI- PFBS |
| 25160 | 10 | 86 | EAdMA-GBLMA-HAdMA | TBPI- PFBS |

Example 6

Preparation of EAdMA-GBLMA-HAdMA Based Acid Catalyzed Resist

Resists were prepared by adding 900 parts of cyclohexanone, 4 parts of PAG, and 0.5 parts of TOA, to an amount of sensitizer and 31:52:19 EAdMA-GBLMA-HadMA in quantities as listed in the table below to make an approximately 10.0% weight of solids to total weight solution. The solution was rolled over night and filtered through a 0.2 μm filter.

| Resist | Parts Sensitizer | Parts Polymer | Sensitizer | PAG |
|---|---|---|---|---|
| 25136 | 0 | 96 | None | TBPI- PFBS |
| 25142 | 2 | 94 | Irgacure 184 | TBPI- PFBS |
| 25143 | 4 | 92 | Irgacure 184 | TBPI- PFBS |
| 25144 | 2 | 94 | Irgacure 651 | TBPI- PFBS |
| 25145 | 4 | 92 | Irgacure 651 | TBPI- PFBS |
| 25146 | 2 | 94 | Irgacure 819 | TBPI- PFBS |
| 24147 | 4 | 92 | Irgacure 819 | TBPI- PFBS |

Example 7

Preparation of HOST-TBA Based Acid Catalyzed Resist

Resists were prepared by adding 900 parts of cyclohexanone, 6 parts of PAG, and 1.5 parts of TOA, to an amount of CHS (sensitizer) and HOST-TBA in quantities as listed in the table below to make an approximately 10.0% weight of solids to total weight solution. The solution was rolled over night and filtered through a 0.2 μm filter.

| Resist | Parts Sensitizer | Parts Polymer | Polymer | PAG |
|---|---|---|---|---|
| 25183 | 0 | 94 | HOST-TBA | TBPI- PFBS |
| 25184 | 1 | 93 | HOST-TBA | TBPI- PFBS |
| 25185 | 2 | 92 | HOST-TBA | TBPI- PFBS |
| 25186 | 4 | 90 | HOST-TBA | TBPI- PFBS |
| 25187 | 7 | 87 | HOST-TBA | TBPI- PFBS |
| 25188 | 10 | 84 | HOST-TBA | TBPI- PFBS |

Example 8

Preparation of MAdMA-GBLMA Based Acid Catalyzed Resist

Resists were prepared by adding 900 parts of cyclohexanone, 4 parts of PAG, and 0.5 parts of TOA, to an amount of CHS (sensitizer) and EAdMA-GBLMA in quantities as listed in the table below to make an approximately 10.0% weight of solids to total weight solution. The solution was rolled over night and filtered through a 0.2 μm filter.

| Resist | Parts Sensitizer | Parts Polymer | Polymer | PAG |
|---|---|---|---|---|
| 25189 | 0 | 96 | MAdMA-GBLMA | TBPI- PFBS |
| 25190 | 1 | 95 | MAdMA-GBLMA | TBPI- PFBS |
| 25191 | 2 | 94 | MAdMA-GBLMA | TBPI- PFBS |
| 25192 | 4 | 92 | MAdMA-GBLMA | TBPI- PFBS |

Example 9

Comparison of EAdMA-GBLMA-HAdMA Based Resists at 193-nm

Resists 25011, 25020, 25021, 25027, 25028, and 25029 were coated to 300-nm on a silicon wafer, PAB baked at 100° C. for 60 s, exposed at 193-nm, PEB baked at 130° C. for 60 s, and developed for 40 s with LLD-26W. Results are given in Table 1.

TABLE 1

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25011 | 0 | 20.9 | 26.5 | 12.1 |
| 25027 | 1 | 5.9 | 14.3 | 10.6 |
| 25020 | 2 | 5.2 | 10.1 | 9.5 |
| 25021 | 4 | 5.7 | 5.3 | 9.6 |
| 25028 | 7 | 5.6 | 8.4 | 10.7 |
| 25029 | 10 | 6.4 | 9.5 | 10.1 |

The example shows that the sensitivity of the resist containing the CHS sensitizer in amounts from 1% to 10% is from 3.2 to 4.0 times more sensitive than the resist that does not contain the CHS sensitizer. This shows that the CHS acts to significantly increase the sensitivity of the resist with 193-nm exposure. The results also show that the UFTL is low in all cases, and that the contrast is high for all resists and all resists are thus capable of being used as a high resolution resists.

Example 10

Comparison of EAdMA-GBLMA-HAdMA Based Resists at 193-nm

Resists 25013, 25022, 25023, 25030, 25031, 25032, 25067, 25068, 25069, and 25070 were coated to 300-nm on a silicon wafer, PAB baked at 100° C. for 60 s, exposed at 193-nm, PEB baked at 130° C. for 60 s, and developed for 40 s with LLD-26W. Results are given in Table 2.

TABLE 2

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25013 | 0 | 8.4 | 7.6 | 11.6 |
| 25067 | 0.1 | 2.9 | 6.0 | 9.8 |
| 25068 | 0.2 | 2.1 | 12.9 | 10.4 |
| 25069 | 0.4 | 2.3 | 7.0 | 9.6 |
| 25070 | 0.7 | 2.5 | 8.8 | 8.9 |
| 25030 | 1 | 2.4 | 6.0 | 11.1 |
| 25022 | 2 | 3.5 | 1.9 | 9.8 |
| 25023 | 4 | 3.3 | 3.8 | 10.4 |
| 25031 | 7 | 3.1 | 12.2 | 10.2 |
| 25032 | 10 | 3.6 | 9.2 | 10.2 |

The example shows that the sensitivity of the resist containing the CHS sensitizer in amounts from 1% to 10% is from 2.3 to 3.5 times more sensitive than the resist that does not contain the CHS sensitizer. This shows that the CHS acts to significantly increase the sensitivity of the resist with 193-nm exposure. The results show that the UFTL is low in all cases, and that the contrast is high for all resists and all resists are thus capable of being used as a high resolution resists.

The example also shows that that the sensitivity of the resist containing the CHS sensitizer in amounts from 0.1% to 1% is from 2.9 to 4.0 times more sensitive than the resist that does not contain the CHS sensitizer. This shows that the CHS acts to significantly increase the sensitivity of the resist with 193-nm exposure even with very lows levels of CHS sensitizer. The results show that the UFTL is low in all cases, and that the contrast is high for all resists and all resists are thus capable of being used as a high resolution resists.

Example 11

Comparison of MAdMA-GBLMA Based Resists at 193-nm

Resists 25033, 25034, 25035, and 25036 were coated to 300-nm on a silicon wafer, PAB baked at 100° C. for 60 s, exposed at 193-nm, PEB baked at 130° C. for 60 s, and developed for 40 s with LLD-26W. Results are given in Table 3.

TABLE 3

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25033 | 0 | 7.4 | 12.7 | 10.8 |
| 25034 | 1 | 6.1 | 42.0 | 10.0 |
| 25035 | 2 | 5.5 | 21.7 | 10.4 |
| 25036 | 4 | 4.6 | 23.5 | 9.8 |

The example shows that the sensitivity of the resist containing the CHS sensitizer in amounts from 1% to 4% is from 1.2 to 1.6 times more sensitive than the resist that does not contain the CHS sensitizer. This shows that the CHS acts to significantly increase the sensitivity of the resist with 193-nm exposure. The results show that the UFTL is low in all cases, and that the contrast is high for all resists and all resists are thus capable of being used as a high resolution resists.

Example 12

Comparison of EAdMA-GBLMA-HAdMA Based Resists at 157-nm

Resists 25013, 25022, and 25023 were coated to 65-nm on a silicon wafer, PAB baked at 100° C. for 60 s, exposed at 157-nm, PEB baked at 130° C. for 60 s, and developed for 40 s with LLD-26W. Results are given in Table 4.

TABLE 4

Lithographic performance with 157-nm exposure.

| Resist | Parts Sensitizer | $E_0$ (mJ/cm$^2$) | Contrast ($\gamma$) | UFTL (nm) |
|---|---|---|---|---|
| 25013 | 0 | 4.8 | 7.7 | 3.7 |
| 25022 | 2 | 1.5 | 7.3 | 3.8 |
| 25023 | 4 | 1.4 | 8.1 | 3.6 |

The example shows that the sensitivity of the resist containing the CHS sensitizer in amounts from 2% to 4% is from 3.2 to 3.4 times more sensitive than the resist that does not contain the CHS sensitizer. This shows that the CHS acts to significantly increase the sensitivity of the resist with 157-nm exposure. The results show that the UFTL is low in all cases, and that the contrast is high for all resists and all resists are thus capable of being used as a high resolution resists.

Example 13

Comparison of EAdMA-GBLMA-HAdMA Based Resist Sat 248-nm

Resists 25011, 25020, and 25021 were coated to 300-nm on a silicon wafer, PAB baked at 100° C. for 60 s, exposed at 248-nm, PEB baked at 130° C. for 60 s, and developed for 40 s with LLD-26W. Results are given in Table 5.

TABLE 5

Lithographic performance with 248-nm exposure.

| Resist | Parts Sensitizer | $E_0$ (mJ/cm$^2$) | Contrast ($\gamma$) | UFTL (nm) |
|---|---|---|---|---|
| 25011 | 0 | 20.1 | 17.4 | 9.0 |
| 25020 | 2 | 10.9 | 10.9 | 9.6 |
| 25021 | 4 | 10.8 | 8.9 | 9.1 |

The example shows that the sensitivity of the resist containing the CHS sensitizer in amounts from 2% to 4% is from 1.8 to 1.9 times more sensitive than the resist that does not contain the CHS sensitizer. This shows that the CHS acts to significantly increase the sensitivity of the resist with 248-nm exposure. The results show that the UFTL is low in all cases, and that the contrast is high for all resists and all resists are thus capable of being used as a high resolution resists.

Example 14

Comparison of EAdMA-GBLMA-HAdMA Based Resists at 248-nm

Resists 25013, 25022, and 25023 were coated to 300-nm on a silicon wafer, PAB baked at 100° C. for 60 s, exposed at 248-nm, PEB baked at 130° C. for 60 s, and developed for 40 s with LLD-26W. Results are given in Table 6.

TABLE 6

Lithographic performance with 248-nm exposure.

| Resist | Parts Sensitizer | $E_0$ (mJ/cm$^2$) | Contrast ($\gamma$) | UFTL (nm) |
|---|---|---|---|---|
| 25013 | 0 | 28.0 | 16.6 | 11.2 |
| 25022 | 2 | 6.4 | 5.1 | 8.4 |
| 25023 | 4 | 6.3 | 5.3 | 5.6 |

The example shows that the sensitivity of the resist containing the CHS sensitizer in amounts from 2% to 4% is from 4.3 to 4.5 times more sensitive than the resist that does not contain the CHS sensitizer. This shows that the CHS acts to significantly increase the sensitivity of the resist with 248-nm exposure. The results show that the UFTL is low in all cases, and that the contrast is high for all resists and all resists are thus capable of being used as a high resolution resists.

Example 15

Comparison of EAdMA-GBLMA-HAdMA Based Resists at 193-nm

Resists 25011, 25041, 25042, and 25043 were coated to 300-nm on a silicon wafer, PAB baked at 100° C. for 60 s, exposed at 193-nm, PEB baked at 130° C. for 60 s, and developed for 40 s with LLD-26W. Results are given in Table 7.

TABLE 7

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25011 | 0 | 20.9 | 26.5 | 12.1 |
| 25041 | 1 | 7.0 | 13.0 | 10.8 |
| 25042 | 2 | 6.4 | 9.0 | 9.6 |
| 25043 | 4 | 7.3 | 14.3 | 9.3 |

The example shows that the sensitivity of the resist containing the PCHSi sensitizer in amounts from 1% to 4% is from 2.8 to 3.3 times more sensitive than the resist that does not contain the PCHSi sensitizer. This shows that the PCHSi acts to significantly increase the sensitivity of the resist with 193-nm exposure. The results show that the UFTL is low in all cases, and that the contrast is high for all resists and all resists are thus capable of being used as a high resolution resists.

Example 16

Comparison of EAdMA-GBLMA-HAdMA Based Resists at 193-nm

Resists 25013, 25044, 25045, and 25046 were coated to 300-nm on a silicon wafer, PAB baked at 100° C. for 60 s, exposed at 193-nm, PEB baked at 130° C. for 60 s, and developed for 40 s with LLD-26W. Results are given in Table 8.

TABLE 8

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25013 | 0 | 8.4 | 7.6 | 11.6 |
| 25044 | 1 | 3.0 | 5.3 | 10.6 |
| 25045 | 2 | 2.8 | 8.5 | 9.8 |
| 25046 | 4 | 3.0 | 8.0 | 9.9 |

The example shows that the sensitivity of the resist containing the PCHSi sensitizer in amounts from 1% to 4% is from 2.8 to 3.0 times more sensitive than the resist that does not contain the PCHSi sensitizer. This shows that the PCHSi acts to significantly increase the sensitivity of the resist with 193-nm exposure. The results show that the UFTL is low in all cases, and that the contrast is high for all resists and all resists are thus capable of being used as a high resolution resists.

Example 17

Comparison of EAdMA-GBLMA-HAdMA Based Resists at 193-nm

Resists 25011, 25020, and 25021 were coated to between 250 and 350-nm in approximate steps of 10-nm on a silicon wafer, PAB baked at 100° C. for 60 s, exposed at 193-nm, PEB baked at 130° C. for 60 s, and developed for 40 s with LLD-26W. Results are given in Table 9.

TABLE 9

Lithographic performance with 193-nm exposure.

| Resist | Parts Sensitizer | Thickness (nm) | $E_0$ (mJ/cm$^2$) | Contrast ($\gamma$) |
|---|---|---|---|---|
| 25011 | 0 | 248 | 5.5 | 11.3 |
| 25011 | 0 | 261 | 7.3 | 22.2 |
| 25011 | 0 | 270 | 9.0 | 13.8 |
| 25011 | 0 | 276 | 9.1 | 21.6 |
| 25011 | 0 | 284 | 7.2 | 39.6 |
| 25011 | 0 | 292 | 6.4 | 17.7 |
| 25011 | 0 | 301 | 6.0 | 9.8 |
| 25011 | 0 | 309 | 6.7 | 15.4 |
| 25011 | 0 | 315 | 7.5 | 23.5 |
| 25011 | 0 | 324 | 9.1 | 11.3 |
| 25011 | 0 | 333 | 8.8 | 14.6 |
| 25020 | 2 | 254 | 4.1 | 15.3 |
| 25020 | 2 | 261 | 5.5 | 9.6 |
| 25020 | 2 | 267 | 5.8 | 8.5 |
| 25020 | 2 | 276 | 7.3 | 15.0 |
| 25020 | 2 | 283 | 5.5 | 14.2 |
| 25020 | 2 | 291 | 4.6 | 15.9 |
| 25020 | 2 | 300 | 4.5 | 12.2 |
| 25020 | 2 | 307 | 4.5 | 34.5 |
| 25020 | 2 | 317 | 5.3 | 14.1 |
| 25020 | 2 | 324 | 6.4 | 10.7 |
| 25020 | 2 | 331 | 6.0 | 15.0 |
| 25021 | 4 | 254 | 4.0 | 11.6 |
| 25021 | 4 | 262 | 5.0 | 10.2 |
| 25021 | 4 | 286 | 4.8 | 13.7 |
| 25021 | 4 | 276 | 6.0 | 13.4 |
| 25021 | 4 | 284 | 4.0 | 12.2 |
| 25021 | 4 | 292 | 4.4 | 9.0 |
| 25021 | 4 | 299 | 3.7 | 10.0 |
| 25021 | 4 | 308 | 4.0 | 9.6 |
| 25021 | 4 | 316 | 4.9 | 8.4 |
| 25021 | 4 | 324 | 4.9 | 11.3 |
| 25021 | 4 | 333 | 4.8 | 11.5 |

The example shows that the sensitivity of the resist containing the CHS sensitizer in amounts of either 2% or 4% is from 1.3 to 1.8 times more sensitive than the resist that does not contain the CHS sensitizer. This shows that the CHS acts to significantly increase the sensitivity of the resist with 193-nm exposure. The results show that contrast is high for all resist thicknesses, and both resists are thus capable of being used as a high resolution resists.

Figure 3:
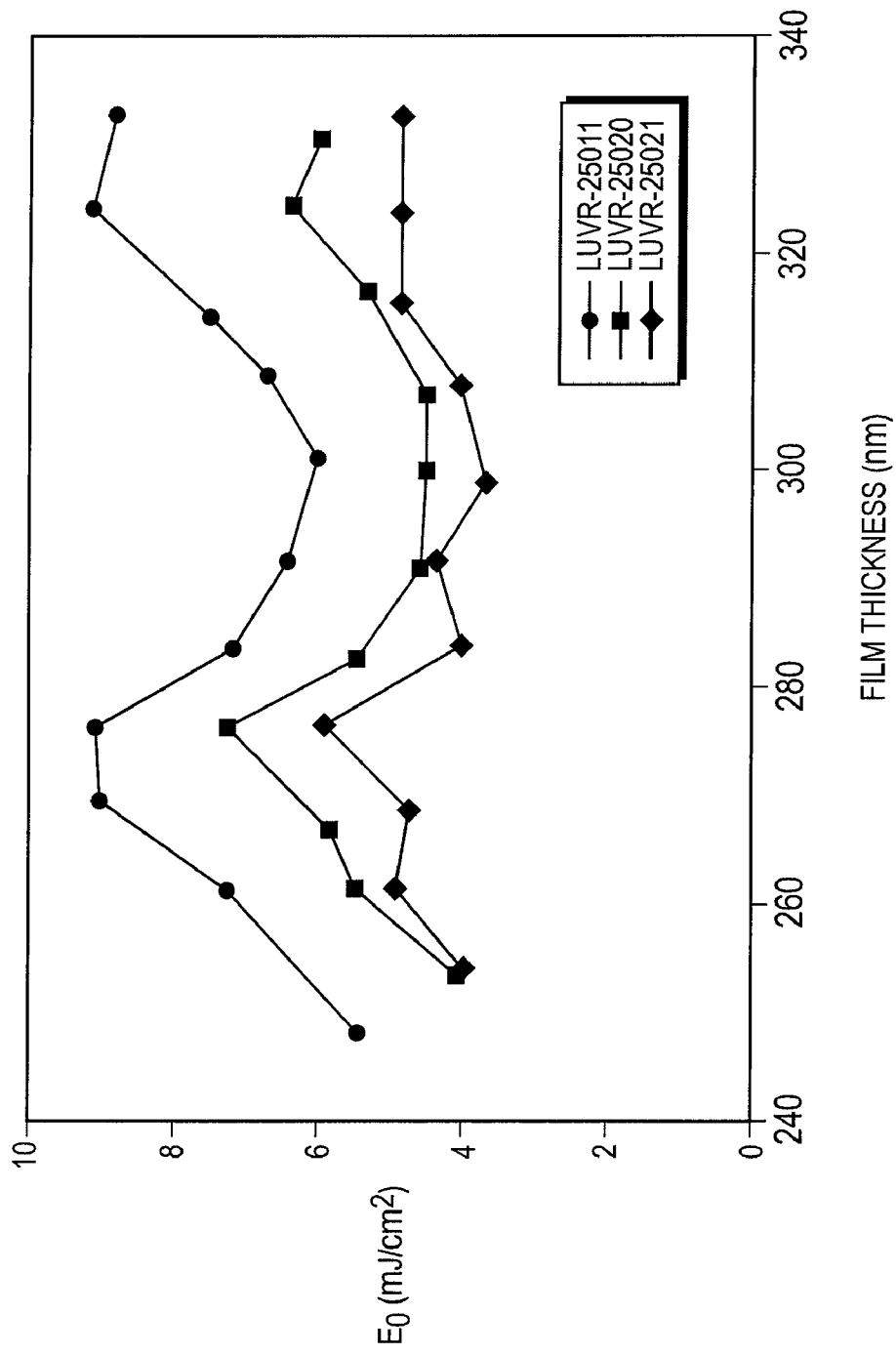
FIG. 3 depicts a graph of the clearing dose as a function of film thickness for three different resist formulations, showing that the two resist formulations with sensitizer exhibit a lower clearing dose (i.e., higher sensitivity) relative to the resist formulation without a sensitizer, in accord with some embodiments of the present invention.

FIG. 3 shows a graph representing the resist sensitivity as a function of resist thickness for resists 25011, 25020, and 25021 using the data in Table 9. This figure shows that the all three resists show a change in sensitivity as a function of resist thickness resulting from the well known effect of constructive and destructive interference of the of the actinic radiation used for exposure. A plot of this type is known as a swing curve to those skilled in the art. At all resist thicknesses, the CHS containing resists, 21020 and 25021, are more sensitive than the 25011 resist.

Example 18

Comparison of EAdMA-GBLMA-HAdMA Based Resists at 193-nm

Resists 25136, 25137, 25138, 25160, 25161, 25162, 26163, 26164, 25165, and 26166 were coated to 250-nm on a silicon wafer, PAB baked at 100° C. for 60 s, exposed at 193-nm, PEB baked at 130° C. for 60 s, and developed for 40 s with LLD-26W. Results are given in Table 10.

TABLE 10

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25136 | 0 | 4.9 | 17.3 | 7.4 |
| 25166 | 0.1 | 4.4 | 18.8 | 7.2 |
| 25165 | 0.2 | 4.1 | 15.4 | 3.6 |
| 25164 | 0.4 | 3.5 | 14.3 | 7.1 |
| 25163 | 0.7 | 3.7 | 20.2 | 7.3 |
| 25162 | 1 | 4.8 | 28.7 | 4.8 |
| 25137 | 2 | 3.6 | 19.9 | 3.7 |
| 25138 | 4 | 3.1 | 14.5 | 4.2 |
| 25161 | 7 | 1.5 | 8.9 | 4.2 |
| 25160 | 10 | 2.0 | 7.9 | 2.0 |

The example shows that the sensitivity of the resist containing the CHS sensitizer in amounts from 2% to 10% is from 1.4 to 3.3 times more sensitive than the resist that does not contain the CHS sensitizer. In addition, the higher levels of CHS sensitizer increase sensitivity the greatest.

This shows that the CHS acts to significantly increase the sensitivity of the resist with 193-nm exposure. The results show that the UFTL is low in all cases, and that the contrast is high for both resists and both resists are thus capable of being used as a high resolution resists.

The example also shows that that the sensitivity of the resist containing the CHS sensitizer in amounts from 0.1% to 1% is from 1.1 to 1.4 times more sensitive than the resist that does not contain the CHS sensitizer. This shows that the CHS acts to significantly increase the sensitivity of the resist with 193-nm exposure even with very lows levels of CHS sensitizer. The results show that the UFTL is low in all cases, and that the contrast is high for all resists and all resists are thus capable of being used as a high resolution resists.

Example 19

Comparison of EAdMA-GBLMA-HAdMA Based Resists at 193-nm

Resists 25136, 25142, 25143, 25144, 25145, 25146, and 25147 were coated to 250-nm on a silicon wafer, PAB baked at 100° C. for 60 s, exposed at 193-nm, PEB baked at 130° C. for 60 s, developed for 40 s with LLD-26W. Results are given in Table 11.

TABLE 11

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25136 | 0 | 4.0 | 18.6 | 10.6 |
| 25142 | 2 | 4.8 | 11.9 | 8.3 |
| 25143 | 4 | 5.4 | 6.6 | 4.9 |
| 25144 | 2 | 4.5 | 17.5 | 4.7 |
| 25145 | 4 | 5.1 | 5.1 | 2.0 |
| 25146 | 2 | 3.8 | 8.6 | 5.1 |
| 24147 | 4 | 4.8 | 8.4 | 10.4 |

The example shows that the sensitivity of the resist containing free radical generators in amounts of either 2% or 4% is either similar to slightly slower than the resist that does not contain the free radical generator. This shows that these free radical generating materials do not act to significantly increase the sensitivity of the resist with 193-nm exposure. The results show that the UFTL is low in all cases, and that the contrast is high for all resists and all resists are thus capable of being used as a high resolution resists.

Example 20

Absorbance of CHS Containing Resists

Resists 25012, 25020, 25021, 25013, 25022, and 25023 were coated to about 250-nm on fused silica, baked at 100° C. for 120 s, and the absorbance at 193 and 248 nm determined. The absorbance of the resist films are reported as $\log_{10}$ in Table 12.

TABLE 12

Absorbance of CHS containing resist films at 193 and 248-nm.

| Resist | Parts Sensitizer | Absorbance at 193-nm ($\mu^{-1}$) | Absorbance at 248-nm ($\mu^{-1}$) |
|---|---|---|---|
| 25012 | 0 | 0.747 | 0.129 |
| 25020 | 2 | 1.075 | 0.185 |
| 25021 | 4 | 1.313 | 0.194 |
| 25013 | 0 | 0.919 | 0.175 |
| 25022 | 2 | 1.195 | 0.189 |
| 25023 | 4 | 1.379 | 0.200 |

The results show that the addition of small amounts of CHS will act to increases the absorbance of the film at both 193 and 248-nm. The addition of this particular sensitizer is very effective at increasing the absorbance at 193-nm and will bleach with exposure.

Example 21

Absorbance of PCHSi Containing Resists

Resists 25041, 25042, 25043, 25044, 25045, and 25046 were coated to about 250-nm on fused silica, baked at 100° C. for 120 s, and the absorbance at 193 and 248 nm determined. The absorbance of the resist films are reported as $\log_{10}$ in Table 13.

TABLE 13

Absorbance of PCHSi containing resist films at 193 and 248-nm.

| Resist | Parts Sensitizer | Absorbance at 193-nm ($\mu^{-1}$) | Absorbance at 248-nm ($\mu^{-1}$) |
|---|---|---|---|
| 25041 | 0 | 0.893 | 0.199 |
| 25042 | 2 | 1.107 | 0.241 |
| 25043 | 4 | 1.141 | 0.297 |
| 25044 | 0 | 1.034 | 0.183 |
| 25045 | 2 | 1.064 | 0.208 |
| 25046 | 4 | 1.261 | 0.292 |

The results show that the addition of small amounts of PCHSi will act to increases the absorbance of the film at both 193 and 248-nm. The addition of this particular sensitizer is very effective at increasing the absorbance at both 193 and 248-nm and will bleach with exposure.

Example 22

Comparison of EAdMA-GBLMA-HAdMA Based Resists at 248-nm

Resists 25136, 25137, 25138, 25160, 25161, and 25162 were coated to 250-nm on a silicon wafer, PAB baked at 100° C. for 60 s, exposed at 248-nm, PEB baked at 130° C. for 60 s, and developed for 40 s with LLD-26W. Results are given in Table 14.

TABLE 14

Lithographic performance with 248-nm exposure.

| Resist | Parts Sensitizer | $E_0$ (mJ/cm$^2$) | Contrast ($\gamma$) | UFTL (nm) |
|---|---|---|---|---|
| 25136 | 0 | 16.6 | 105.2 | 3.6 |
| 25162 | 1 | 16.0 | 90.2 | 5.8 |
| 25137 | 2 | 15.7 | 94.8 | 5.7 |
| 25138 | 4 | 12.6 | 75.9 | 6.0 |
| 25161 | 7 | 6.3 | 35.2 | 4.0 |
| 25160 | 10 | 6.9 | 43.8 | 3.0 |

The example shows that that the sensitivity of the resist containing the CHS sensitizer in amounts from 1% to 10% is from 1.1 to 2.6 times more sensitive than the resist that does not contain the CHS sensitizer. The results show that the UFTL is low in all cases and that the contrast is high for all resists and all resists are thus capable of being used as a high resolution resists.

Example 23

Comparison of HOST-TBA Based Resists at 248-nm

Resists 25183, 25184, 25185, 25186, 25187, and 25188 were coated to 250-nm on a silicon wafer, PAB baked at 100°

C. for 60 s, exposed at 248-nm, PEB baked at 130° C. for 60 s, developed for 40 s with LLD-26W. Results are given in Table 15.

TABLE 15

Lithographic performance with 248-nm exposure.

| Resist | Parts Sensitizer | $E_0$ (mJ/cm$^2$) | Contrast ($\gamma$) | UFTL (nm) |
|---|---|---|---|---|
| 25183 | 0 | 11.8 | 45.2 | 17.2 |
| 25184 | 1 | 9.9 | 7.3 | 17.5 |
| 25185 | 2 | 10.5 | 67.3 | 16.5 |
| 25186 | 4 | 10.1 | 54.9 | 16.2 |
| 25187 | 7 | 9.3 | 52.2 | 18.1 |
| 25188 | 10 | 8.0 | 27.5 | 14.5 |

The example shows that that the sensitivity of the resist containing the CHS sensitizer in amounts from 1% to 10% is from 1.1 to 1.5 times more sensitive than the resist that does not contain the CHS sensitizer. The results show that the UFTL is low in all cases, and that the contrast is high for all resists and all resists are thus capable of being used as a high resolution resists.

Example 24

Comparison of EAdMA-GBLMA-HAdMA Based Resists at 157-nm

Resists 25136, 25137, 25138, 25161, and 25162 were coated to 65-nm on a silicon wafer, PAB baked at 100° C. for 60 s, exposed at 157-nm, PEB baked at 130° C. for 60 s, and developed for 40 s with LLD-26W. Results are given in Table 16.

TABLE 16

Lithographic performance with 157-nm exposure.

| Resist | Parts Sensitizer | $E_0$ (mJ/cm$^2$) | Contrast ($\gamma$) | UFTL (nm) |
|---|---|---|---|---|
| 25136 | 0 | 1.3 | 4.6 | 1.3 |
| 25162 | 1 | 1.0 | 4.4 | 7.8 |
| 25137 | 2 | 0.6 | 5.4 | 0.9 |
| 25138 | 4 | 0.4 | 3.0 | 0.9 |
| 25161 | 7 | 0.4 | 2.9 | 4.0 |

The example shows that the sensitivity of the resist containing the CHS sensitizer in amounts from 2% to 4% is from 1.3 to 3.3 times more sensitive than the resist that does not contain the CHS sensitizer. This shows that the CHS acts to significantly increase the sensitivity of the resist with 157-nm exposure. The results show that the UFTL is low in all cases, and that the contrast is high for all resists and all resists are thus capable of being used as a high resolution resists.

Example 25

Comparison of MAdMA-GBLMA Based Resists at 193-nm

Resists 25189, 25190, 25191, 25192, 25193, 25194, 25195, and 25196 were coated to 250-nm on a silicon wafer, PAB baked at 100° C. for 60 s, exposed at 193-nm, PEB baked at 130° C. for 60 s, and developed for 40 s with LLD-26W. Results are given in Table 17.

TABLE 17

Lithographic performance with 193-nm exposure.

| Resist | Parts Sensitizer | $E_0$ (mJ/cm$^2$) | Contrast ($\gamma$) | UFTL (nm) |
|---|---|---|---|---|
| 25189 | 0 | 4.4 | 38.2 | 7.0 |
| 25190 | 1 | 3.0 | 43.1 | 6.9 |
| 25191 | 2 | 2.6 | 22.9 | 7.3 |
| 25192 | 4 | 2.1 | 27.2 | 7.2 |

The example shows that the sensitivity of the resist containing the CHS sensitizer in amounts from 1% to 4% is from up to 1.5 to 2.1 times more sensitive than the resist that does not contain the CHS sensitizer. This shows that the CHS acts to significantly increase the sensitivity of the resist with 193-nm exposure. The results show that the UFTL is low in all cases, and that the contrast is high for all resists and all resists are thus capable of being used as a high resolution resists.

Example 26

Comparison of MAdMA-GBLMA Based Resists Exposed to E-Beam

Resists 25136, 25137, and 25138 were coated to 250-nm on a silicon wafer, PAB baked at 100° C. for 60 s, exposed with 50 kV electron beam, PEB baked at 130° C. for 60 s, developed for 40 s with LLD-26W. Results are given in Table 18.

TABLE 18

Lithographic performance with electron beam exposure.

| Resist | Parts Sensitizer | $E_0$ ($\mu$C/cm$^2$) | Contrast ($\gamma$) | UFTL (nm) |
|---|---|---|---|---|
| 25136 | 0 | 10.0 | 64.2 | 6.7 |
| 25137 | 2 | 8.8 | 55.3 | 5.6 |
| 25138 | 4 | 7.6 | 45.9 | 7.4 |

The example shows that the sensitivity of the resist containing the CHS sensitizer in amounts from 1% to 4% is from up to 1.1 to 1.3 times more sensitive than the resist that does not contain the CHS sensitizer. This shows that the CHS acts to significantly increase the sensitivity of the resist with electron beam exposure. The results show that the UFTL is low in all cases, and that the contrast is high for all resists and all resists are thus capable of being used as a high resolution resists.

Example 27

Comparison of EAdMA-GBLMA-HAdMA Based Resists at 248-nm

Rohm and Haas AR3 was coated to 62-nm on a silicon wafer and baked for 220° C. for 60 s. Resists 25136, 25137, 25138, and 25161 were then coated to 250-nm on the AR3 coated silicon wafer, PAB baked at 100° C. for 60 s, exposed at 248-nm on a Canon 0.6NA stepper, PEB baked at 130° C. for 60 s, and developed for 40 s with LLD-26W. Results are given in Table 19.

TABLE 19

Lithographic performance with 248-nm exposure.

| Resist | Parts Sensitizer | $E_0$ (mJ/cm$^2$) | Contrast ($\gamma$) | UFTL (nm) |
|---|---|---|---|---|
| 25136 | 0 | 25.2 | 183.7 | 5.4 |
| 25137 | 2 | 21.4 | 215.7 | 4.9 |
| 25138 | 4 | 20.0 | 187.3 | 4.9 |
| 25161 | 7 | 10.8 | 88.9 | 3.9 |

The example shows that that the sensitivity of the resist containing the CHS sensitizer in amounts from 1% to 7% is from 1.2 to 2.3 times more sensitive than the resist that does not contain the CHS sensitizer. The results show that the UFTL is low in all cases, and that the contrast is high for all resists and all resists are thus capable of being used as a high resolution resists.

Equivalents

While the present invention has been described in terms of specific methods, structures, and devices it is understood that variations and modifications will occur to those skilled in the art upon consideration of the present invention. For example, the methods and compositions discussed herein can be utilized beyond the preparation of metallic surfaces for implants in some embodiments. As well, the features illustrated or described in connection with one embodiment can be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not to be limited by what has been particularly shown and described, except as indicated by the appended claims.

All publications and references are herein expressly incorporated by reference in their entirety. The terms "a" and "an" can be used interchangeably, and are equivalent to the phrase "one or more" as utilized in the present application. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

What is claimed is:

1. A method of imaging a resist in a lithographic process, comprising:
    forming a resist on a substrate, the resist capable of being imaged by lithographic radiation, the resist comprising:
    a) a polymeric matrix material, wherein the polymeric matrix material does not include substantial silicon-silicon atom bonding,
    b) an acid-generator for creating an acid when the resist is exposed to the lithographic radiation, and
    c) a sensitizer for increasing the sensitivity of the resist to the lithographic radiation, the sensitizer comprising a compound having at least one silicon-silicon bond; and
    applying the lithographic radiation to the resist to oxidize at least one silicon-silicon bond and thereby enhance imaging, wherein the sensitizer comprises less than about 0.10 weight fraction of the total amount of the acid-generator, the sensitizer, and the polymeric matrix material.

2. The method of claim 1, wherein the step of applying the lithographic radiation further comprises increasing acid production in the resist relative to acid production with the sensitizer removed from the resist, thereby increasing the sensitivity of the resist.

3. The method of claim 2, wherein the step of increasing acid production results in an increase in sensitivity of the resist of at least about 10% relative to the sensitivity of the resist with the sensitizer removed.

4. The method of claim 2, wherein the step of increasing acid production results in an increase in sensitivity of the resist of at least about 100% relative to the sensitivity of the resist with the sensitizer removed.

5. The method of claim 1, wherein the step of applying the lithographic radiation includes reacting the polymeric matrix material in an acid-catalyzed reaction using the acid created by the acid-generator.

6. The method of claim 1, further comprising:
    contacting a developer with the resist to remove portions of the resist exposed to the lithographic radiation.

7. The method of claim 1, further comprising:
    contacting a developer with the resist to remove portions of the resist unexposed to the lithographic radiation.

8. The method of claim 1, wherein the lithographic radiation includes at least one of electromagnetic radiation, ion beam, and electron beam.

9. The method of claim 8, wherein the electromagnetic radiation includes radiation having a wavelength in a range of about 0.1 nm to about 260 nm.

10. The method of claim 9, wherein the electromagnetic radiation includes radiation having a wavelength in the range of about 140 nm to about 220 nm.

11. The method of claim 8, wherein the lithographic radiation includes an electron beam.

12. The method of claim 1, wherein the step of applying the lithographic radiation includes at least partially bleaching a portion of the resist exposed to the lithographic radiation.

13. The method of claim 1, wherein the step of applying the lithographic radiation includes lowering the absorbance of a portion of the resist exposed to the lithographic radiation.

14. The method of claim 1, wherein the sensitizer comprises at least one of a polysilane, a polysilyne, and a non-polymeric organosilicon composition.

15. A composition for generating an acid during lithographic processing, comprising:
    a polymeric matrix material capable of undergoing an acid catalyzed reaction with the acid formed by the acid-generator, wherein the polymeric matrix material does not include substantial silicon-silicon atom bonding,
    an acid-generator capable of creating an acid when activated by lithographic radiation; and
    a sensitizer for increasing efficiency of acid generation when activated by lithographic radiation; the sensitizer comprising a compound having at least one silicon-silicon bond, the compound being susceptible to oxidation upon exposure to lithographic radiation, wherein the sensitizer comprises less than about 0.10 weight fraction of the total amount of the acid-generator, the sensitizer, and the polymeric matrix material.

16. The composition of claim 15, wherein the composition is a mixture.

17. The composition of claim 15, wherein the sensitizer increases acid creation in the composition when the composition is exposed to a selected lithographic radiation relative to not having the sensitizer in the composition.

18. The composition of claim 15, wherein the sensitizer comprises a polysilane including a plurality of units represented by the following structural formula:

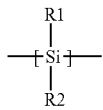

wherein R1 and R2 are each an independent organic moiety.

19. The composition of claim 18, wherein at least one of R1 and R2 is an optionally substituted aliphatic or aromatic organic moiety.

20. The composition of claim 19, wherein the at least one of R1 and R2 is substituted with at least one of acyl halide, alcohol, aldehyde, alkane, alkene, alkyne, amide, amine, ammonium, arene, azide, heteroarene, azide, carboxylic acid, disulfide, epoxide, ester, ether, halide, hydroxyl, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

21. The composition of claim 19, wherein the at least one of R1 and R2 is an optionally substituted fluoroaliphatic organic moiety.

22. The composition of claim 15, wherein the sensitizer comprises a polysilyne including a plurality of units represented by the following structural formula:

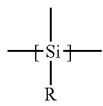

wherein each R is an independent organic moiety.

23. The composition of claim 22, wherein at least one R is an optionally substituted aliphatic or aromatic organic moiety.

24. The composition of claim 23, wherein the at least one R is substituted with at least one of acyl halide, alcohol, aldehyde, alkane, alkene, alkyne, amide, amine, ammonium, arene, azide, heteroarene, azide, carboxylic acid, disulfide, epoxide, ester, ether, halide, hydroxyl, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

25. The composition of claim 23, wherein the at least one R is an optionally substituted fluoroaliphatic organic moiety.

26. The composition of claim 15, wherein the sensitizer comprises a non-polymeric organosilicon composition.

27. The composition of claim 26, wherein at least a portion of the non-polymeric organosilicon composition comprises a molecule with units according to the following structural formula:

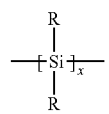

wherein each R is an independent organic moiety, and x is an integer in the range of 2 to 20.

28. The composition of claim 27, wherein the non-polymeric organosilicon composition includes a linear silicon chain backbone.

29. The composition of claim 27, wherein the non-polymeric organosilicon composition includes a cyclic silicon chain backbone.

30. The composition of claim 27, wherein at least one R is an optionally substituted aliphatic or aromatic organic moiety.

31. The composition of claim 30, wherein the at least one R is substituted with at least one of acyl halide, alcohol, aldehyde, alkane, alkene, alkyne, amide, amine, ammonium, arene, azide, heteroarene, azide, carboxylic acid, disulfide, epoxide, ester, ether, halide, hydroxyl, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

32. The composition of claim 31, wherein the at least one R is an optionally substituted fluoroaliphatic organic moiety.

33. The composition of claim 15, wherein the sensitizer comprises at least about 0.001 weight fraction of the total amount of the acid-generator, the sensitizer, and the polymeric matrix material.

34. The composition of claim 15, wherein the sensitizer comprises at least about 0.005 weight fraction of the total amount of the acid-generator, the sensitizer, and the polymeric matrix material.

35. The composition of claim 15, further comprising:
a base additive.

36. The composition of claim 15, wherein the sensitizer increases acid creation in a composition formed from the acid-generator, sensitizer, and polymeric matrix material when the composition is exposed to a selected lithographic radiation relative to not having the sensitizer in the composition.

37. The composition of claim 15, wherein the sensitizer comprises at least one of a polysilane, a polysilyne, and a non-polymeric organosilicon composition.

38. A method of imaging a resist in a lithographic process, comprising:
    forming a resist on a substrate, the resist capable of being imaged by lithographic radiation, the resist comprising:
        a) an acid-generator for creating an acid when the resist is exposed to the lithographic radiation, and
        b) a sensitizer for increasing the sensitivity of the resist to the lithographic radiation, the sensitizer comprising a compound having at least one silicon-silicon bond;
    applying the lithographic radiation to the resist to oxidize at least one silicon-silicon bond and thereby enhance imaging; and
    contacting a developer with the resist to remove portions of the resist unexposed to the lithographic radiation.

39. The method of claim 38, wherein the lithographic radiation includes at least one of electromagnetic radiation, ion beam, and electron beam.

40. The method of claim 39, wherein the electromagnetic radiation includes radiation having a wavelength in a range of about 0.1 nm to about 260 nm.

41. The method of claim 40, wherein the electromagnetic radiation includes radiation having a wavelength in the range of about 140 nm to about 220 nm.

42. The method of claim 39, wherein the lithographic radiation includes an electron beam.

43. The method of claim 38, wherein the step of applying the lithographic radiation includes at least partially bleaching a portion of the resist exposed to the lithographic radiation.

44. The method of claim 38, wherein the step of applying the lithographic radiation includes lowering the absorbance of a portion of the resist exposed to the lithographic radiation.

45. A composition for generating an acid during lithographic processing, comprising:
an acid-generator capable of creating an acid when activated by lithographic radiation; and
a sensitizer for increasing efficiency of acid generation when activated by lithographic radiation; the sensitizer comprising a non-polymeric organosilicon composition having at least one silicon-silicon bond,
the compound being susceptible to oxidation upon exposure to lithographic radiation, wherein the sensitizer comprises less than about 0.10 weight fraction relative to the total amount of the composition.

46. The composition of claim 45, wherein at least a portion of the non-polymeric organosilicon composition comprises a molecule with units according to the following structural formula:

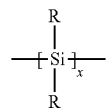

wherein each R is an independent organic moiety, and x is an integer in the range of 2 to 20.

47. The composition of claim 46, wherein the non-polymeric organosilicon composition includes a linear silicon chain backbone.

48. The composition of claim 46, wherein the non-polymeric organosilicon composition includes a cyclic silicon chain backbone.

49. The composition of claim 46, wherein at least one R is an optionally substituted aliphatic or aromatic organic moiety.

50. The composition of claim 49, wherein the at least one R is substituted with at least one of acyl halide, alcohol, aldehyde, alkane, alkene, alkyne, amide, amine, ammonium, arene, azide, heteroarene, azide, carboxylic acid, disulfide, epoxide, ester, ether, halide, hydroxyl, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

51. The composition of claim 50, wherein the at least one R is an optionally substituted fluoroaliphatic organic moiety.

* * * * *